(12) United States Patent
Fukagawa et al.

(10) Patent No.: US 7,346,886 B2
(45) Date of Patent: Mar. 18, 2008

(54) METHOD AND APPARATUS FOR DETERMINING CHIP ARRANGEMENT POSITION ON SUBSTRATE

(75) Inventors: Youzou Fukagawa, Tochigi-ken (JP); Mario Nakamori, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 493 days.

(21) Appl. No.: 11/103,459

(22) Filed: Apr. 12, 2005

(65) Prior Publication Data

US 2005/0253215 A1  Nov. 17, 2005

(30) Foreign Application Priority Data

Apr. 13, 2004  (JP) ............................. 2004-118223

(51) Int. Cl.
*G06F 17/50* (2006.01)
(52) U.S. Cl. .......................................... 716/21; 716/19
(58) Field of Classification Search .................. 716/21, 716/19; 257/467
See application file for complete search history.

(56) References Cited

U.S. PATENT DOCUMENTS 6,314,548 B1   11/2001   Suzuki ........................ 716/11

FOREIGN PATENT DOCUMENTS

| JP | 63-250811   | 10/1988 |
| JP | 7-211622    | 8/1995  |
| JP | 11-274053   | 10/1999 |
| JP | 2000-195824 | 7/2000  |
| JP | 2003-257843 | 9/2003  |

*Primary Examiner*—Sun James Lin
(74) *Attorney, Agent, or Firm*—Fitzpatrick, Cella, Harper & Scinto

(57) ABSTRACT

In determining a relative position between a chip lattice including rectangular cells, each of which has a size of a chip to be formed on a substrate and an effective area on the substrate, one representative cell in the chip lattice is divided into a plurality of partial areas in accordance with an existing area, of a representative point of the effective area, in which chip sets trimmed from the chip lattice with the effective area are identical. A partial area corresponding to a chip set including a maximum number of chips is specified from the plurality of partial areas, and the representative point is set in the specified partial area.

5 Claims, 20 Drawing Sheets

FIG. 11A

```
──────── ALGORITHM <AREA-SEARCH> ────────

Input : MATRIX Z AND INITIAL VERTEX $v_0$

Output : ALL VERTEXES AND THEIR SCORES

Procedure : PREPARE SETS $\Phi$, $\Psi$, AND $\Omega$ AND MAKE THEM EMPTY

ADD INITIAL VERTEX $v_0$ TO $\Phi$ AND $\Psi$ AND 0 TO $\Omega$ while   SET $\Phi$ IS NOT EMPTY EXTRACT VERTEX v FROM TOP OF SET $\Phi$ if   VERTEX $v_1$ ADJACENT TO v IS PRESENT if   $v_1$ IS NOT ELEMENT OF $\Psi$ ADD $v_1$ TO $\Phi$ AND $\Psi$ ADD VALUE OF $Z(v, v_1)$ TO $\Omega$ end end end
```

| | |
|---|---|
| WAFER DIAMETER | 200mm |
| ORIENTATION FLAT LENGTH | 57.5mm |
| INEFFECTIVE WIDTH | 10mm |
| HORIZONTAL CHIP SIZE | 15mm |
| VERTICAL CHIP SIZE | 15mm |
| NUMBER OF CHIPS | 93 PIECES |

| WAFER DIAMETER | 200mm |
| --- | --- |
| ORIENTATION FLAT LENGTH | 57.5mm |
| INEFFECTIVE WIDTH | 10mm |
| HORIZONTAL CHIP SIZE | 10mm |
| VERTICAL CHIP SIZE | 10mm |
| NUMBER OF CHIPS | 223 PIECES |

| WAFER DIAMETER | 200mm |
| --- | --- |
| ORIENTATION FLAT LENGTH | 57.5mm |
| INEFFECTIVE WIDTH | 10mm |
| HORIZONTAL CHIP SIZE | 5mm |
| VERTICAL CHIP SIZE | 5mm |
| NUMBER OF CHIPS | 952 PIECES |

METHOD AND APPARATUS FOR DETERMINING CHIP ARRANGEMENT POSITION ON SUBSTRATE

FIELD OF THE INVENTION

The present invention relates to a technique of determining the relative position between a substrate and a chip lattice comprised of rectangular cells each of which has a size of a chip to be formed on the substrate.

BACKGROUND OF THE INVENTION

A semiconductor chip is obtained by dicing an oblong or square chip 101 formed on a substantially disk-shaped silicon wafer. For this reason, chips on a wafer are often arranged orderly in a lattice pattern, as shown in FIG. 1. In addition, a wafer effective area 102, where a predetermined sensitizer film thickness is ensured, is set to maintain a predetermined distance from the outer edge of a wafer 100. If a chip is not wholly placed in the range of the wafer effective area 102, the chip 101 can be defective even when it is wholly present inside the wafer 100. Even when a dicing line (103) called an orientation flat is present, a predetermined distance is set between the wafer effective area 102 and the edge formed by the orientation flat 103.

An exposure apparatus prints a pattern such that a plurality of chips are arranged in a lattice pattern in the wafer effective area 102. When the relative positional relationship between the lattice-like chip arrangement (also called a chip lattice) and the wafer effective area changes, the number of chips available from one wafer varies. Hence, it is demanded to obtain, from the relationship between the wafer effective area and the chip shape (size), a relative positional relationship between the chip lattice and the wafer effective area to acquire chips as many as possible.

As prior arts related to the wafer position determination method, Japanese Patent Laid-Open Nos. 07-211622 (to be referred to as patent reference 1 hereinafter), 2000-195824 (to be referred to as patent reference 2 hereinafter), and 2003-257843 (to be referred to as patent reference 3 hereinafter) are proposed.

The wafer position determination method disclosed in patent reference 1 is a four-point comparison method (to be referred to as a method A hereinafter) in which a position where the number of available chips is maximized is selected for four cases wherein one of the chip center, corner, and the median of each side is set at the wafer center. The wafer position determination method disclosed in patent reference 2 is a multiple-point comparison method (to be referred to as a method B hereinafter) in which the number of available chips is counted while setting, at the wafer center, a plurality of points set in the chip plane, and a position where the number of available chips is maximized is selected as the wafer center. In both patent references 1 and 2, the point at which the number of available chips is maximized is selected as the wafer center from a plurality of set points. These methods cannot always guarantee an optimum solution. Patent reference 3 discloses a method capable of reliably presenting the relative position between the wafer and the chip lattice which maximize the number of available chips (the method disclosed in patent reference 3 will be referred to as a method C hereinafter).

However, the method disclosed in patent reference 3 presents a relative position when the chip set available on the wafer is in contact with the boundary of the wafer effective area at two or more points. For this reason, although the number of available chips is correct, if the relative position slightly shifts from the presented relative position, chips can be off the wafer effective area and become ineffective.

In this case, a plurality of relative positions where the number of available chips is maximized are set as the area boundary of relative positions where a set with the maximum number of chips is available, and the center of gravity (e.g., the center of gravity of the position of a wafer representative point corresponding to the relative position when the chip lattice is fixed) of these relative positions is set as the wafer position (wafer representative point position). However, if there are a plurality of sets which include chips in equal and maximum number in different chip set shapes, the number of available chips when the center of gravity is set as the wafer position is not always maximum even when the center of gravity of relative positions (wafer representative points) corresponding to the sets are obtained.

SUMMARY OF THE INVENTION

It is an exemplified object of the present invention to provide a novel technique of determining the relative position between a substrate and a chip lattice.

According to one aspect of the present invention, there is provided a method of determining a relative position between a chip lattice comprised of rectangular cells each of which has a size of a chip to be formed on a substrate and an effective area on the substrate, the method comprising: a division step of dividing one representative cell in the chip lattice into a plurality of partial areas in accordance with an existing area, of a representative point of the effective area, in which chip sets trimmed from the chip lattice with the effective area are identical; a specifying step of specifying a partial area corresponding to a chip set including a maximum number of chips from the plurality of partial areas; and a setting step of setting the representative point in the partial area specified in the specifying step.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

A preferred embodiment of the present invention will now be described in detail in accordance with the accompanying drawings.

In a chip arrangement determination method according to this embodiment, a predetermined position (e.g., central position when the wafer effective area is regarded as a circle) of a wafer effective area 102 is defined as a representative point. An arbitrary chip area of an infinitely spreading chip-size lattice is defined as a central chip 108. First, the wafer effective area 102 is arranged such that the representative point is placed in the central chip 108. The position of the representative point at which the number of available chips is maximized when the representative point is moved within the range of the central chip 108 is searched for. More specifically, the central chip 108 is divided into partial areas (same chip number areas) which represent the existing range of representative points at which identical chip sets are available. A partial area corresponding to a chip set with a maximum number of chips is detected. The position of the representative point (i.e., the position of the wafer) is determined in the partial area.

Division of the central chip 108 into same chip number areas will be described by using a wafer area having a more generalized shape.

Figure 1:
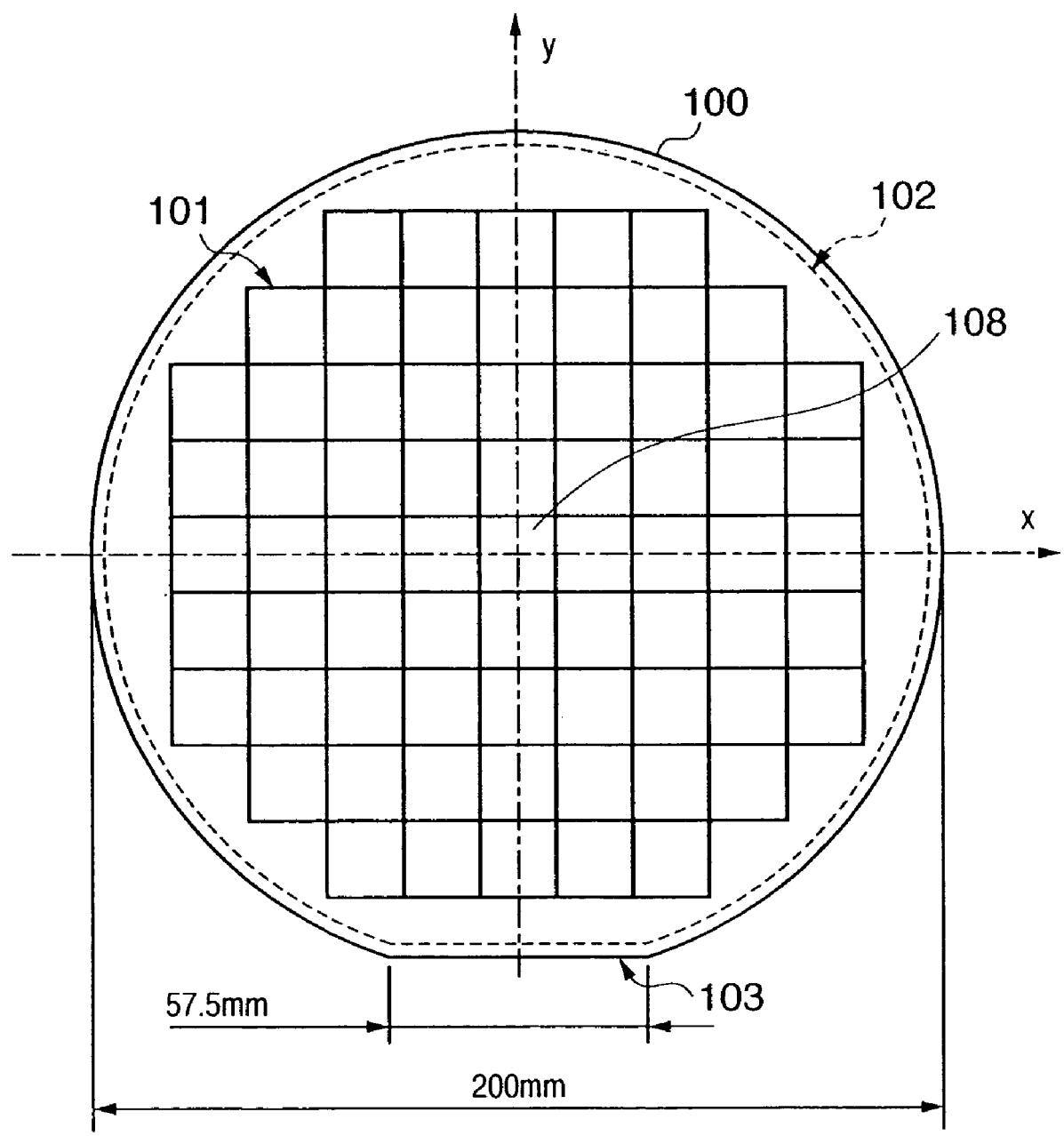
FIG. 1 is a view showing a general chip array on a wafer.
Figure 2:
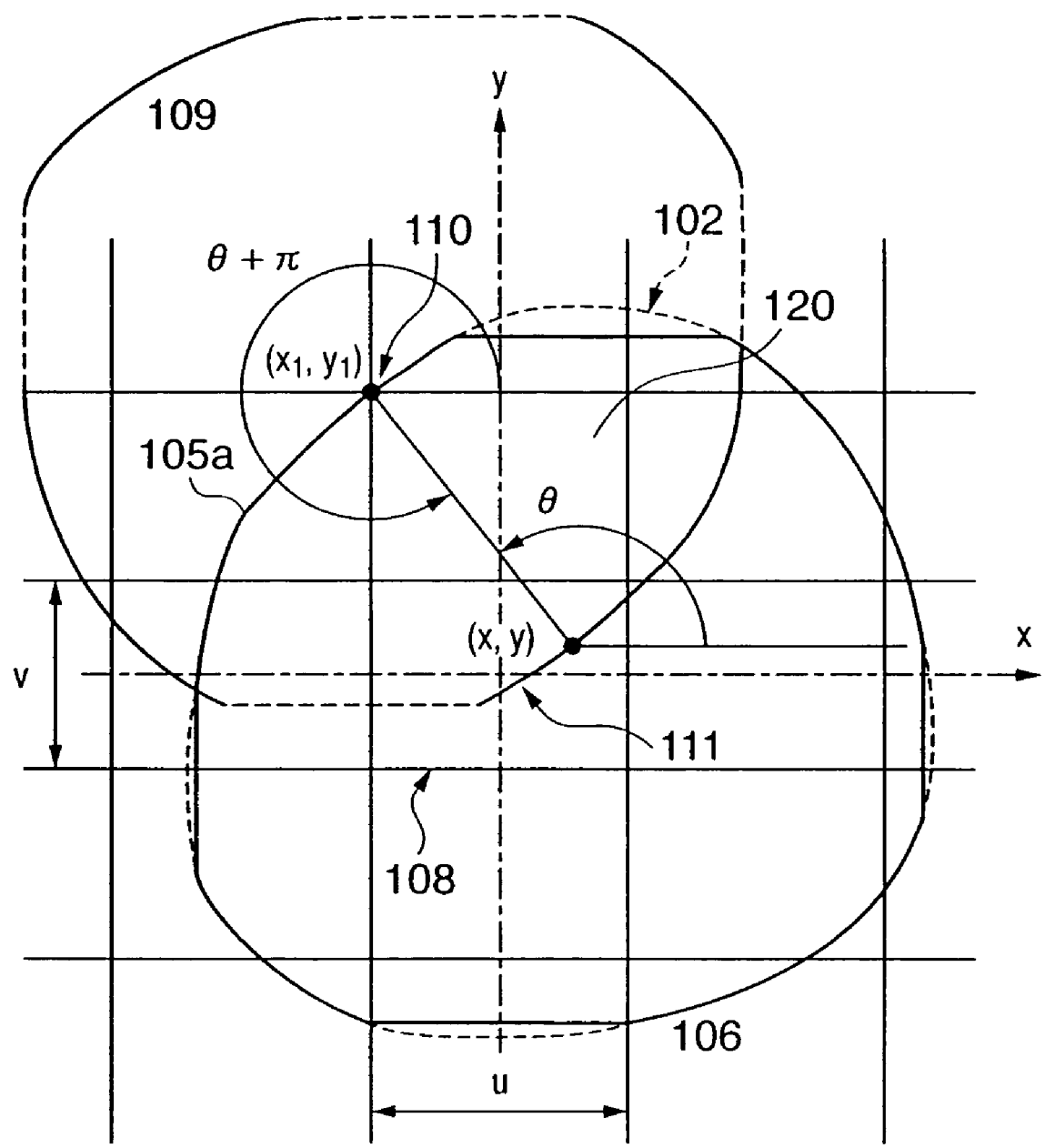
FIG. 2 is a view showing the relationship between an effective circle, boundary circle, and central chip.

Referring to FIG. 2, a rectangular chip (oblong chip in this example) which has a horizontal size u and vertical size v and its center at the origin of the X-Y coordinates system is called the central chip 108. A lattice which infinitely spreads from the central chip 108 is present (the size of each cell is the chip size). The lattice is partially covered with the wafer effective area 102.

Figure 3:
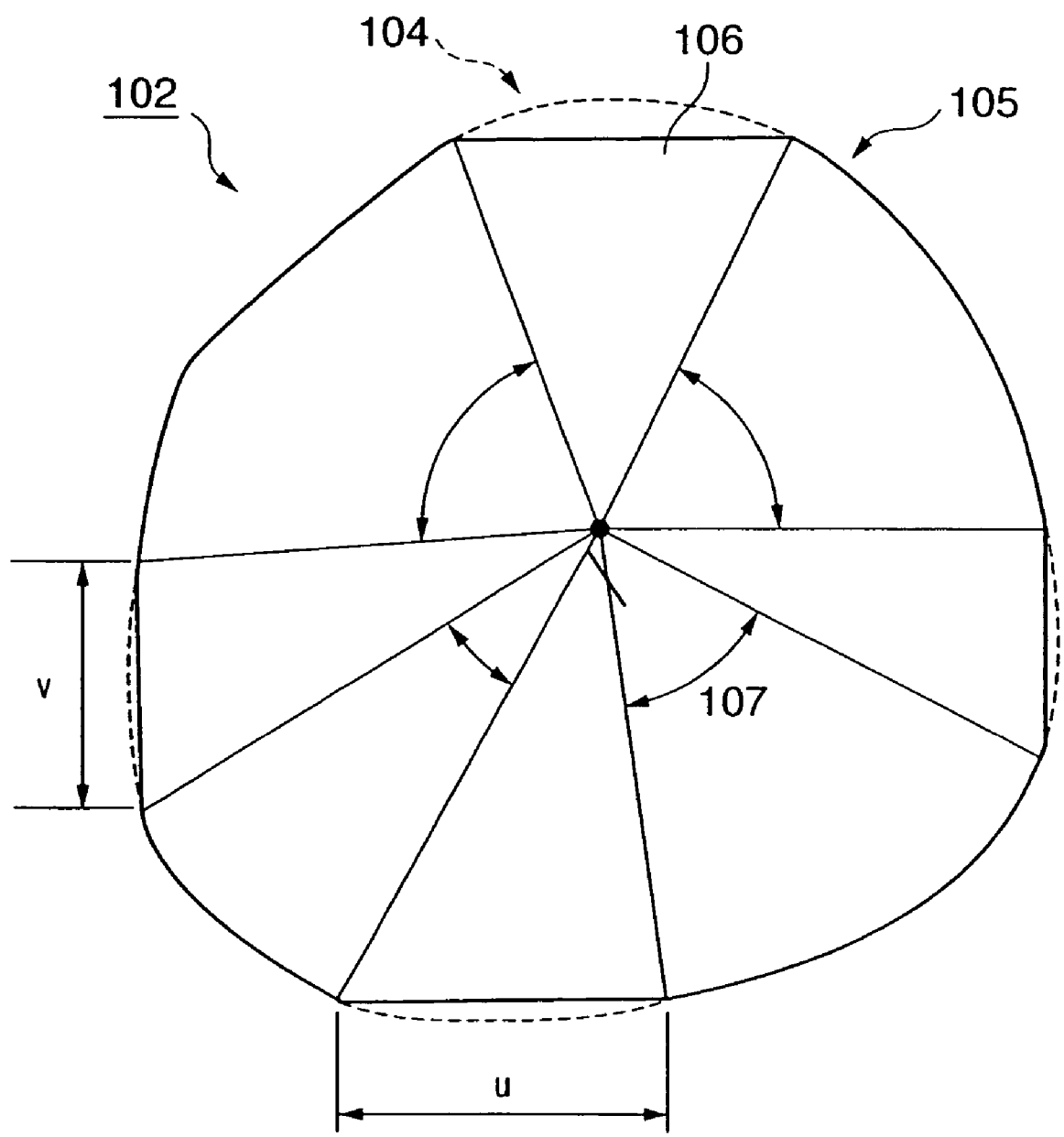
FIG. 3 is a view for explaining the effective arcs, ineffective arcs, and effective angles in the effective circle.

FIG. 3 shows details of the wafer effective area 102 in this example. Referring to FIG. 3, terms are defined as follows.

Wafer effective area 102: A closed area which guarantees that chips completely covered with this area should be available as non-defective products.

Ineffective arc 104: An arc which has, at its two ends, intersections between a line parallel to the vertical or horizontal lattice lines and the outer periphery of the wafer effective area. The distance between the two intersections equals u or v. A chip having a vertex on this arc cannot entirely be placed in the effective area.

Effective arc 105: An arc which is obtained by excluding ineffective arcs from the outer periphery of the wafer effective area. When a vertex is present on this arc, one chip including the vertex is available.

Effective circle 106: A convex closed curve which is formed by connecting adjacent effective arcs by line segments.

Effective angle 107: An azimuth from an effective circle representative point to a point on an effective arc.

In the above definition, the meaning of the term "arc" includes "circular arc", and the meaning of the term "circle" includes "convex closed curve".

Since the problem of arranging the effective area 102 (effective circle 106) on the uniform lattice has a unique periodicity, only a case in which the representative point (x,y) of the effective circle 106 is present in the central chip 108 needs to be examined. This condition is given by $$-u/2 \leq x \leq u/2 \tag{1-a}$$

$$-v/2 \leq y \leq v/2 \tag{1-b}$$

An arbitrary point (x1,y1) on the effective arc 105 is given by $$x_1 = r(\theta)\cos(\theta) + x \tag{2-a}$$

$$y_1 = r(\theta)\sin(\theta) + y \tag{2-b}$$

$$\theta \in \Theta e \tag{2-c}$$

where $\Theta e$ is the set of effective angles.

As shown in FIG. 2, when the effective arc 105 is located on the position (lattice point 110) of the vertex coordinates $(x_1, y_1)$ of the chip lattice, the position of the representative point (x,y) of the effective circle 106 is given by $$x = r(\theta)\cos(\theta + \pi) + x_1 \tag{3-a}$$

$$y = r(\theta)\sin(\theta + \pi) + y_1 \tag{3-b}$$

$$\theta \in \Theta e \tag{3-c}$$

At this time, a closed curve represented by expressions (3-a) to (3-c) is the locus of the representative points of the effective circle 106 when the effective circle 106 is moved while keeping the effective arc 105 in contact with the lattice point 110 (coordinates $(x_1, y_1)$ in FIG. 2). Of this locus, a locus obtained when the effective circle is moved while keeping an arc 105a in contact with the lattice point 110 indicates the boundary portion of an area where a chip 120 having the lattice point 110 as the vertex farthest from the origin is included in the effective circle 106. Hence, the locus forms the boundary portion between areas with the same number of available chips.

A closed curve represented by expressions (3-a) to (3-c) is called a boundary circle 109. The boundary circle 109 present in the central chip 108 is called a boundary arc 111. The lattice point 110 serving as the representative point of the boundary circle is called the boundary circle representative point 110. The boundary circle 109 and boundary arc 111 have a shape obtained by rotating the effective circle 106 and effective arc 105 by 180°. The boundary circle representative point 110 is a point on the lattice and therefore satisfies $$x_1 = u/2 + u \times i \quad (4\text{-}a)$$

$$y_1 = v/2 + v \times j \quad (4\text{-}b)$$

where i and j are integers.

From expressions (1-a), (1-b), and (2-a) to (2-c), we obtain $$r(\theta)\cos(\theta) - u/2 \leq x_1 \leq r(\theta)\cos(\theta) + u/2 \quad (5\text{-}a)$$

$$r(\theta)\sin(\theta) - v/2 \leq y_1 \leq r(\theta)\sin(\theta) + v/2 \quad (5\text{-}b)$$

$$\theta \in \Theta e \quad (5\text{-}c)$$

These expressions represent the existing area of the boundary circle representative point 110.

Figure 4:
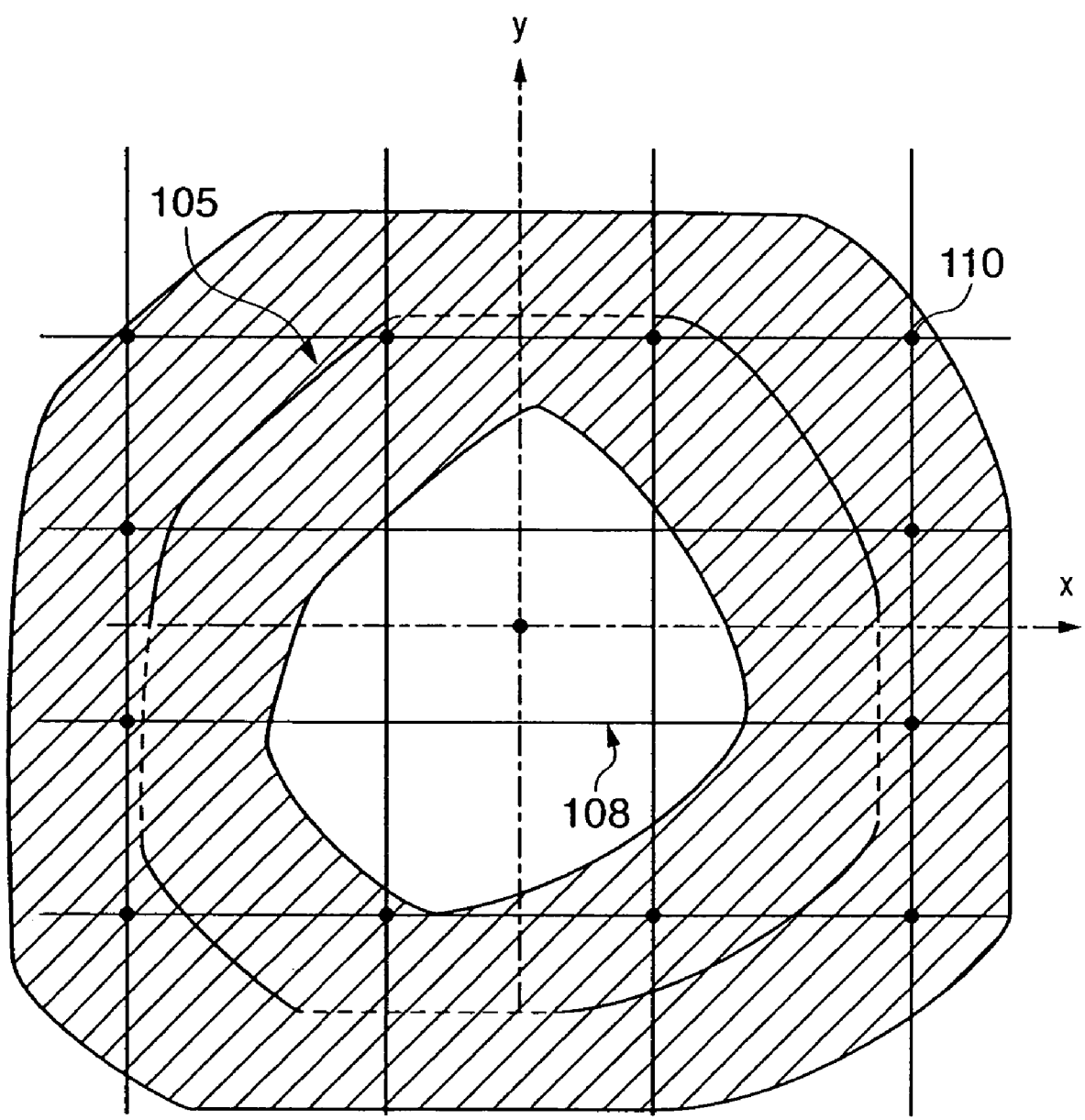
FIG. 4 is a view for explaining the existing area of circle representative points.

The existing area of the boundary circle representative point 110, which is defined by expressions (5-a) to (5-c), is a doughnut-shaped area having the central chip 108 at the center, as shown in FIG. 4. This is because the existing area of the boundary circle representative point 110 represented by the above expressions corresponds to the locus of the chip when the chip center is moved on the effective arc 105 (effective circle 106). Referring to FIG. 4, 12 lattice points are present in the existing area. These points are defined as boundary representative points. As the existing area of the boundary circle representative point, the area obtained by moving the chip center on the effective arc 105 is used. Instead, an area obtained by moving the chip center on the wafer effective area 102 may be used. In this case, however, some unnecessary lattice points may be included in calculating the boundary circle.

Figure 5:
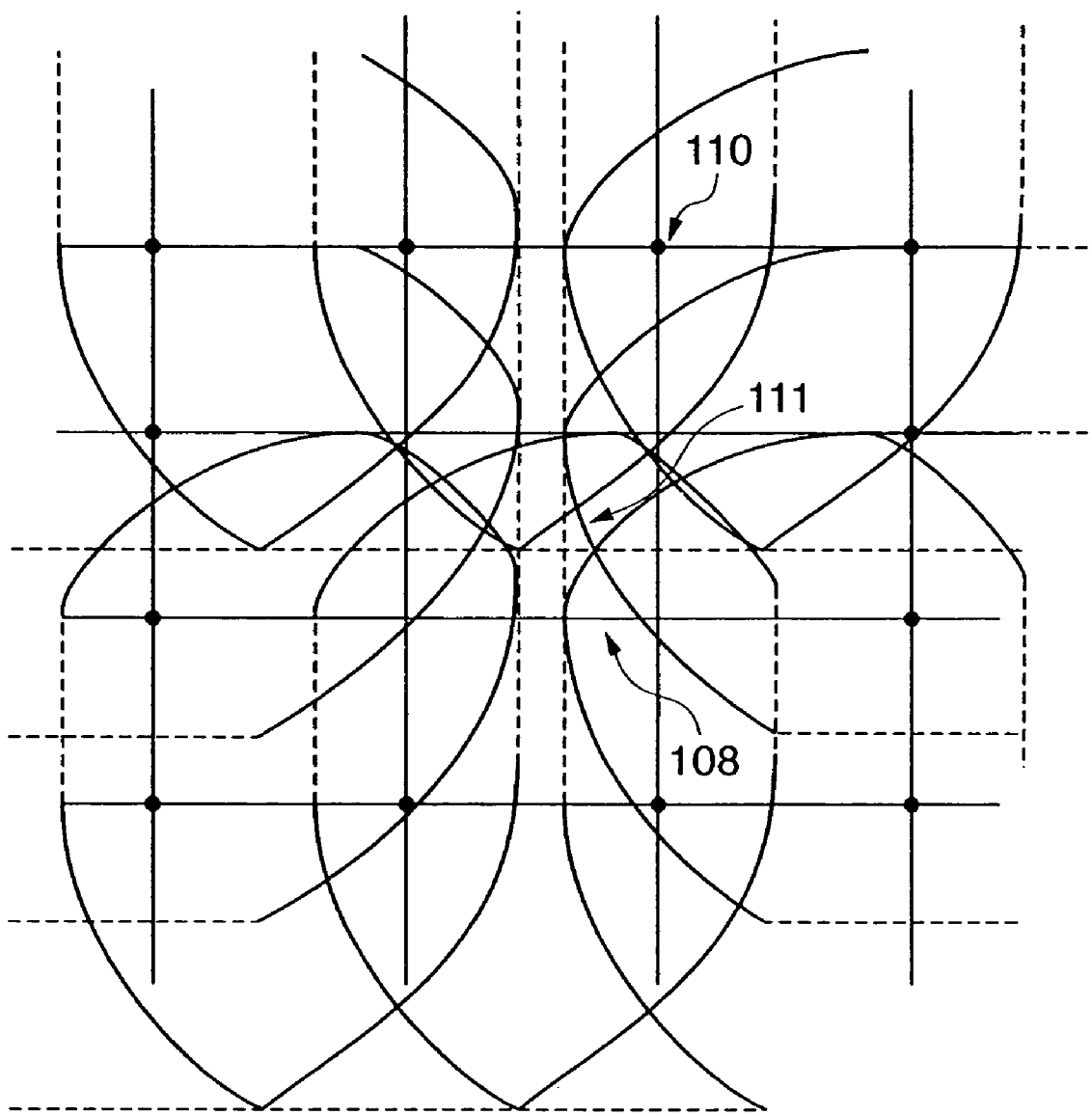
FIG. 5 is a view showing boundary arcs and boundary points corresponding to the boundary circle representative points in FIG. 4.

FIG. 5 shows the boundary arcs 111 corresponding to all the obtained boundary point representative points 110. Points at which the boundary arcs 111 cross each other in the central chip 108 are called boundary points. The boundary points on the boundary arcs 111 are arranged sequentially, and the boundary arcs are divided into sides (to be referred to as boundary sides hereinafter) sandwiched between boundary points.

The boundary points and boundary sides in the central chip 108 are obtained for the wafer effective area formed by a general convex closed curve. Areas with the same number of available chips (to be referred to as same chip number areas) are algebraically derived from the information of the obtained boundary points and boundary sides.

Figure 6:
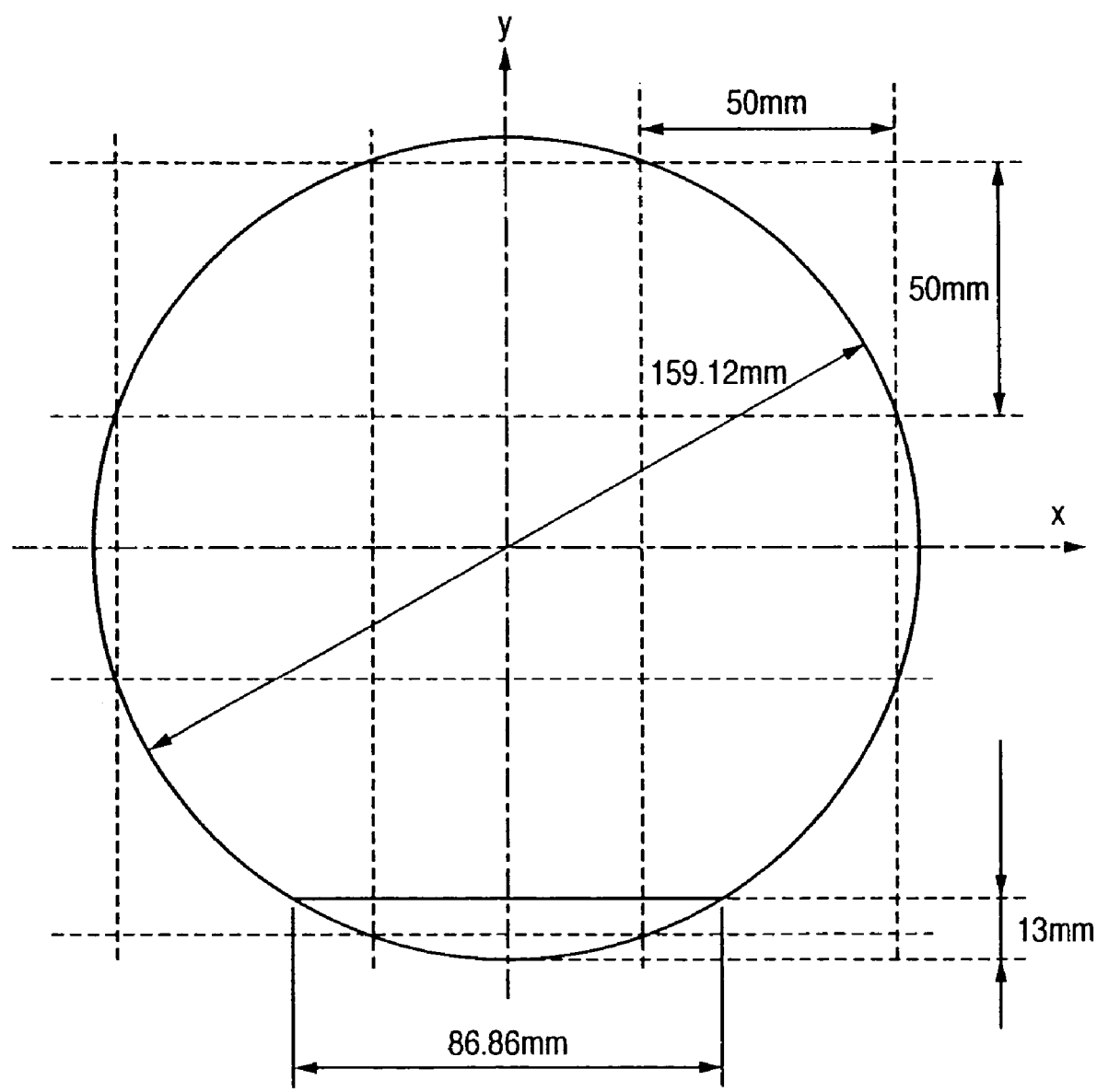
FIG. 6 is a view showing a wafer shape in the example.

The same chip number area detection method will be described by using an example closer to an actual wafer shape. For example, assume a wafer having an effective diameter of 159.12 mm and an orientation flat length of 86.86 mm should be arranged on a chip lattice with a vertical/horizontal pitch of 50 mm, as shown in FIG. 6.

For the descriptive convenience, the Y-axis positive direction is defined as "up". Since the wafer effective area is bilaterally symmetric, graphics obtained by dividing into the same chip number areas are also bilaterally symmetric. Only the right half of a chip will be considered. The right half portion is called a half chip area.

Figure 7:
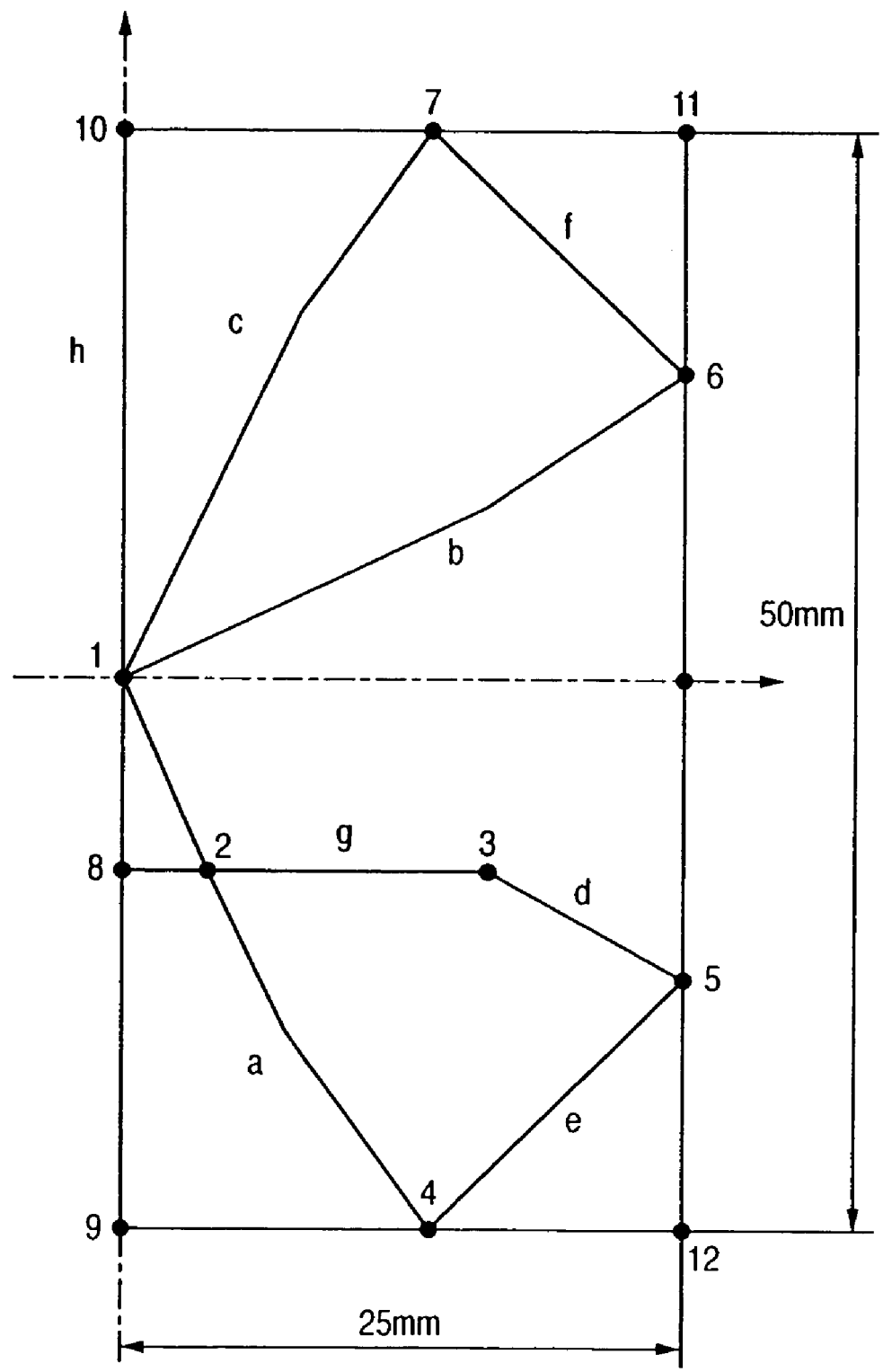
FIG. 7 is a view showing boundary arcs and boundary points in the example shown in FIG. 6.

In this case, as shown in FIG. 7, seven boundary arcs a to g are obtained as the boundary arcs 111 which pass through the half chip area. An outer periphery h of the half chip is also added. Boundary points as the intersections between the boundary arcs are detected. In the example shown in FIG. 7, boundary points 1 to 12 are present. The boundary points included in the boundary arcs are arranged in ascending order of azimuth (azimuth in a corresponding boundary circle) for each boundary arc. Table 1 shows the position coordinates of the boundary points and boundary circle representative points.

TABLE 1

| No. | Boundary Point Position (mm) | Boundary Circle Representative Point Position (mm) | Azimuth (deg) | Path |
|---|---|---|---|---|
| 1 | (0.00, 0.00) | (75.00, 25.00) | −161.6 | a |
| 2 | (3.60, −8.94) | (75.00, 25.00) | −154.6 | a |
| 4 | (13.76, −25.00) | (75.00, 25.00) | −140.8 | a |
| 1 | (0.00, 0.00) | (−25.00, 75.00) | −71.6 | b |
| 6 | (25.00, 13.76) | (−25.00, 75.00) | −35.9 | b |
| 7 | (13.76, 25.00) | (75.00, −25.00) | 140.8 | c |
| 1 | (0.00, 0.00) | (75.00, −25.00) | 161.6 | c |
| 5 | (25.00, −13.76) | (−25.00, −75.00) | 50.8 | d |
| 3 | (18.43, −8.94) | (−25.00, −75.00) | 56.7 | d |
| 5 | (25.00, −13.76) | (75.00, −75.00) | 129.2 | e |
| 4 | (13.76, −25.00) | (75.00, −75.00) | 140.8 | e |
| 7 | (13.76, 25.00) | (75.00, 75.00) | −140.8 | f |
| 6 | (25.00, 13.76) | (75.00, 75.00) | −129.2 | f |
| 3 | (18.43, −8.94) | (0.00, −75.00) | 74.4 | g |
| 2 | (3.60, −8.94) | (0.00, −75.00) | 86.9 | g |
| 8 | (0.00, −8.94) | (0.00, −75.00) | 90.0 | g |
| 8 | (0.00, −8.94) | (12.50, 0.00) | −144.4 | h |
| 9 | (0.00, −25.00) | (12.50, 0.00) | −116.6 | h |
| 4 | (13.76, −25.00) | (12.50, 0.00) | −87.1 | h |
| 12 | (25.00, −25.00) | (12.50, 0.00) | −63.4 | h |
| 5 | (25.00, −13.76) | (12.50, 0.00) | −47.8 | h |
| 6 | (25.00, 13.76) | (12.50, 0.00) | 47.8 | h |
| 11 | (25.00, 25.00) | (12.50, 0.00) | 63.4 | h |
| 7 | (13.76, 25.00) | (12.50, 0.00) | 87.1 | h |
| 10 | (0.00, 25.00) | (12.50, 0.00) | 116.6 | h |
| 1 | (0.00, 0.00) | (12.50, 0.00) | 180.0 | h |

Since the adjacent relationship between the boundary points is obtained, boundary sides having the boundary points at the two ends can be obtained. A planar graph formed by the boundary points and boundary sides is formed on the half chip area. Each plane (each area) of the planar graph is a same chip number area where a predetermined chip set is obtained. A chip area with the maximum number of available chips is detected from the same chip number areas. The representative point of the wafer effective area is determined in the detected chip area. The representative point can easily visually be specified. However, some processes are necessary for algebraically specifying it.

Figure 8:
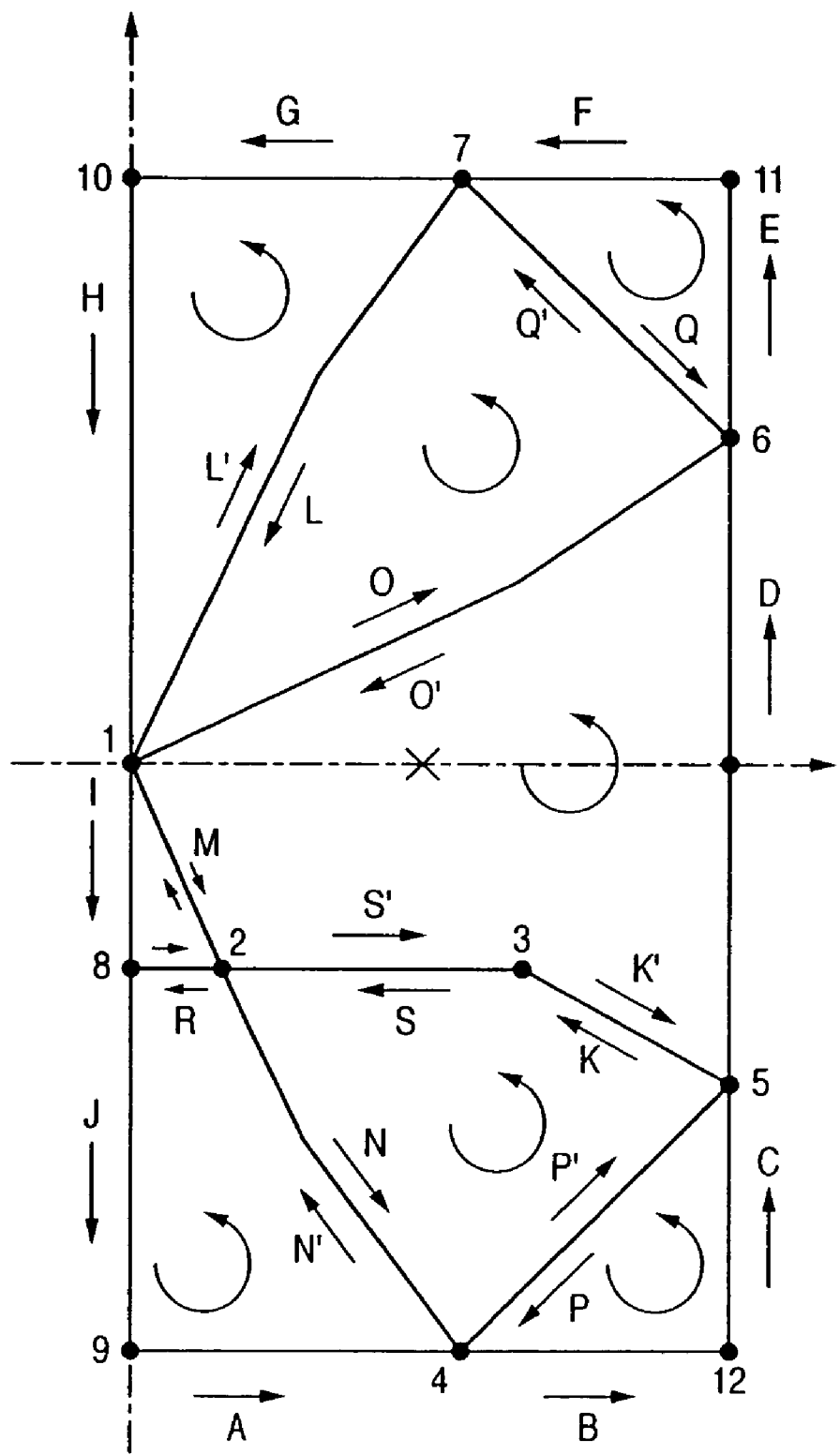
FIG. 8 is a view for explaining division to same chip number areas by the boundary arcs and boundary points shown in FIG. 7.

As shown in FIG. 8, all sides (A to J) which form the outer periphery h of the half chip area are defined as directed sides in the counterclockwise (or clockwise) direction. The azimuths (X-axis positive direction is defined as 0°) of the respective sides are also recorded. All sides (K to S) which form the internal paths are also defined as directed sides in the counterclockwise direction (corresponding boundary circles are traced counterclockwise). In addition, directed sides (K' to S') in the opposite direction are given, and their azimuths (X-axis positive direction is defined as 0°) are recorded.

Weights are given to the directed sides. The weight for the outer peripheral sides is 0, the weight for the directed sides in the direction to trace the original boundary circles counterclockwise is +1, and the weight for the remaining sides is −1. When the orientation flat line is equal to or longer than twice of the chip width u, a plurality of boundary sides overlap. In this case, the number of overlapping sides is set as the absolute value of the weight for the directed sides. Table 2 shows the azimuths, the position coordinates of the original boundary circle representative points and azimuths from them to the directed side start points, and the weights of the respective directed sides.

TABLE 2

| Side | Azimuth of Side (deg) | Boundary Circle Representative Point Position (mm) | Start Point Azimuth (deg) | Weight |
|---|---|---|---|---|
| A(9-4) | 0.0 | (−12.50, 0.00) | −116.6 | 0 |
| B(4-12) | 0.0 | (−12.50, 0.00) | −87.1 | 0 |
| C(12-5) | 90.0 | (−12.50, 0.00) | −63.4 | 0 |
| D(5-6) | 90.0 | (−12.50, 0.00) | −47.7 | 0 |
| E(6-11) | 90.0 | (−12.50, 0.00) | 47.7 | 0 |
| F(11-7) | 180.0 | (−12.50, 0.00) | 63.4 | 0 |
| G(7-10) | 180.0 | (−12.50, 0.00) | 87.1 | 0 |
| H(10-1) | −90.0 | (−12.50, 0.00) | 116.6 | 0 |
| I(1-8) | −90.0 | (−12.50, 0.00) | 180.0 | 0 |
| J(8-9) | −90.0 | (−12.50, 0.00) | −144.4 | 0 |
| K(5-3) | 143.7 | (−25.00, −75.00) | 50.8 | 1 |
| K'(3-5) | −36.3 | (−25.00, −75.00) | 56.7 | −1 |
| L(7-1) | −118.8 | (75.00, −25.00) | 140.8 | 1 |
| L'(1-7) | 61.2 | (75.00, −25.00) | 161.6 | −1 |
| M(1-2) | −68.1 | (75.00, 25.00) | −161.6 | 1 |
| M'(2-1) | 111.9 | (75.00, 25.00) | −154.6 | −1 |
| N(2-4) | −57.7 | (75.00, 25.00) | −154.6 | 1 |
| N'(4-2) | 122.3 | (75.00, 25.00) | −140.8 | −1 |
| O(1-6) | 28.8 | (−25.00, 75.00) | −71.6 | 1 |
| O'(6-1) | −151.2 | (−25.00, 75.00) | −50.8 | −1 |
| P(5-4) | −135.0 | (75.00, −75.00) | −129.2 | 1 |
| P'(4-5) | 45.0 | (75.00, −75.00) | 140.8 | −1 |
| Q(7-6) | −45.0 | (75.00, 75.00) | −140.8 | 1 |
| Q'(6-7) | 135.0 | (75.00, 75.00) | −129.2 | −1 |
| R(2-8) | 180.0 | (0.00, −75.00) | 86.9 | 1 |
| R'(8-2) | 0.0 | (0.00, −75.00) | 90.0 | −1 |
| S(3-2) | 180.0 | (0.00, −75.00) | 74.4 | 1 |
| S'(2-3) | 0.0 | (0.00, −75.00) | 86.9 | −1 |

Next, same chip number areas surrounded by the boundary points and directed sides are specified. All the same chip number areas shown in FIG. 8 can be surrounded by the directed sides connected counterclockwise. Hence, a same chip number area can be formed as a subset of directed sides. For example, the side A(9-4) in Table 2 is connected to directed sides B(4-12), P'(4-5), and N'(4-2). The side N'(4-2) which forms the largest angle counterclockwise with the side A(9-4) is selected. In this way, sides to be connected are selected until returning to the vertex at the start point. With this method, a subset including the sides representing a same chip number area as elements can be formed. When the same operation as described above is repeated for the remaining directed sides except those included in the formed subset, a plurality of subsets are formed. The half chip area can be divided into a plurality of same chip number areas. Each directed side is included in at least one of the plurality of subsets. In the example shown in FIG. 8, the half chip area is divided into eight same chip number areas.

Each divided same chip number area has a relationship in increase/decrease in number of available chips with respect to an adjacent area. Table 2 shows the weights of the respective directed sides. When the weight of a directed side at the boundary to an adjacent same chip number area is positive, the number of available chips is larger in that area than in the same chip number area adjacent through the directed side.

Figure 9:
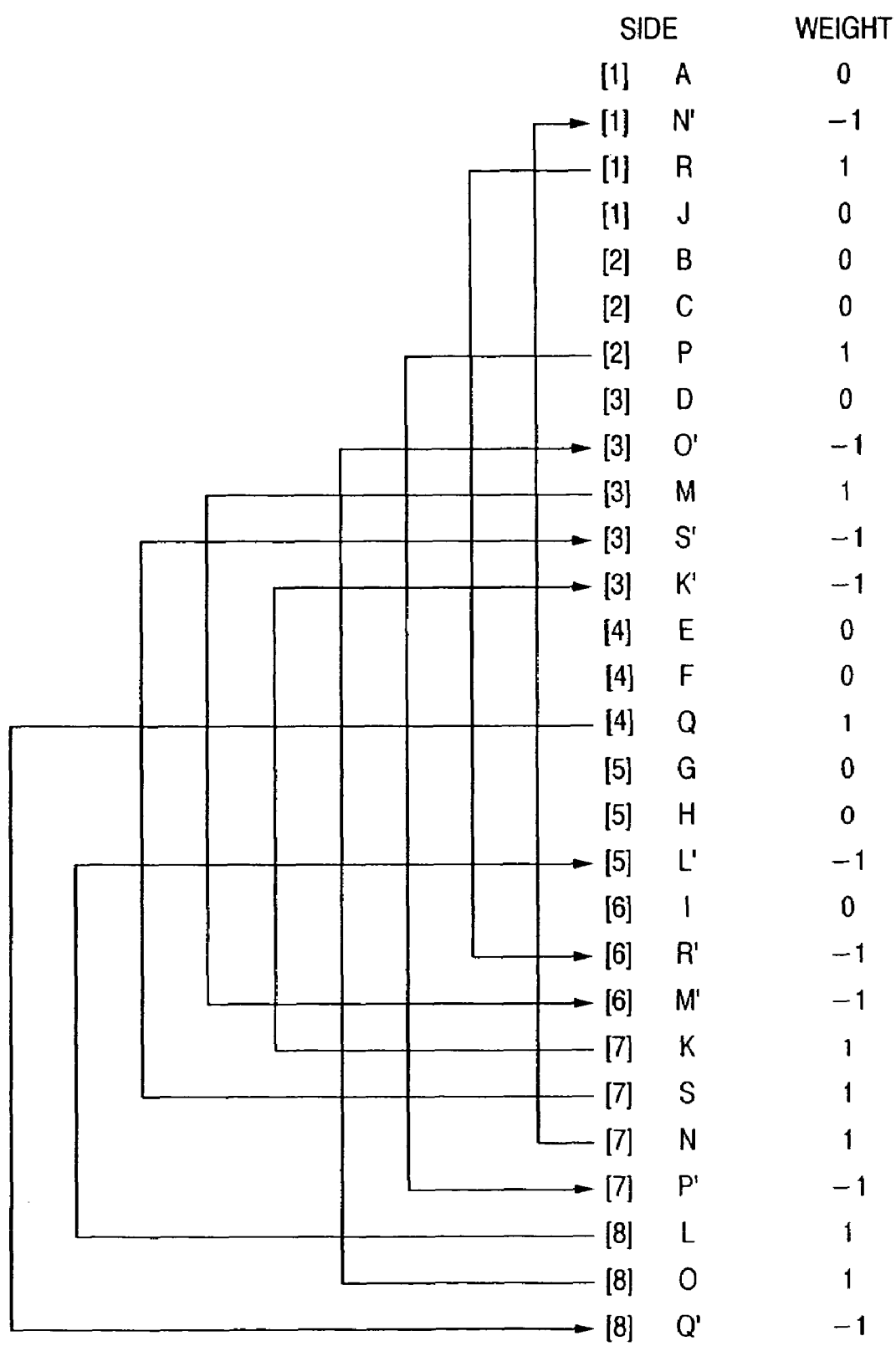
FIG. 9 is a view for explaining the relationship in increase/decrease in number of chips between the same chip number areas shown in FIG. 8.
Figure 10:
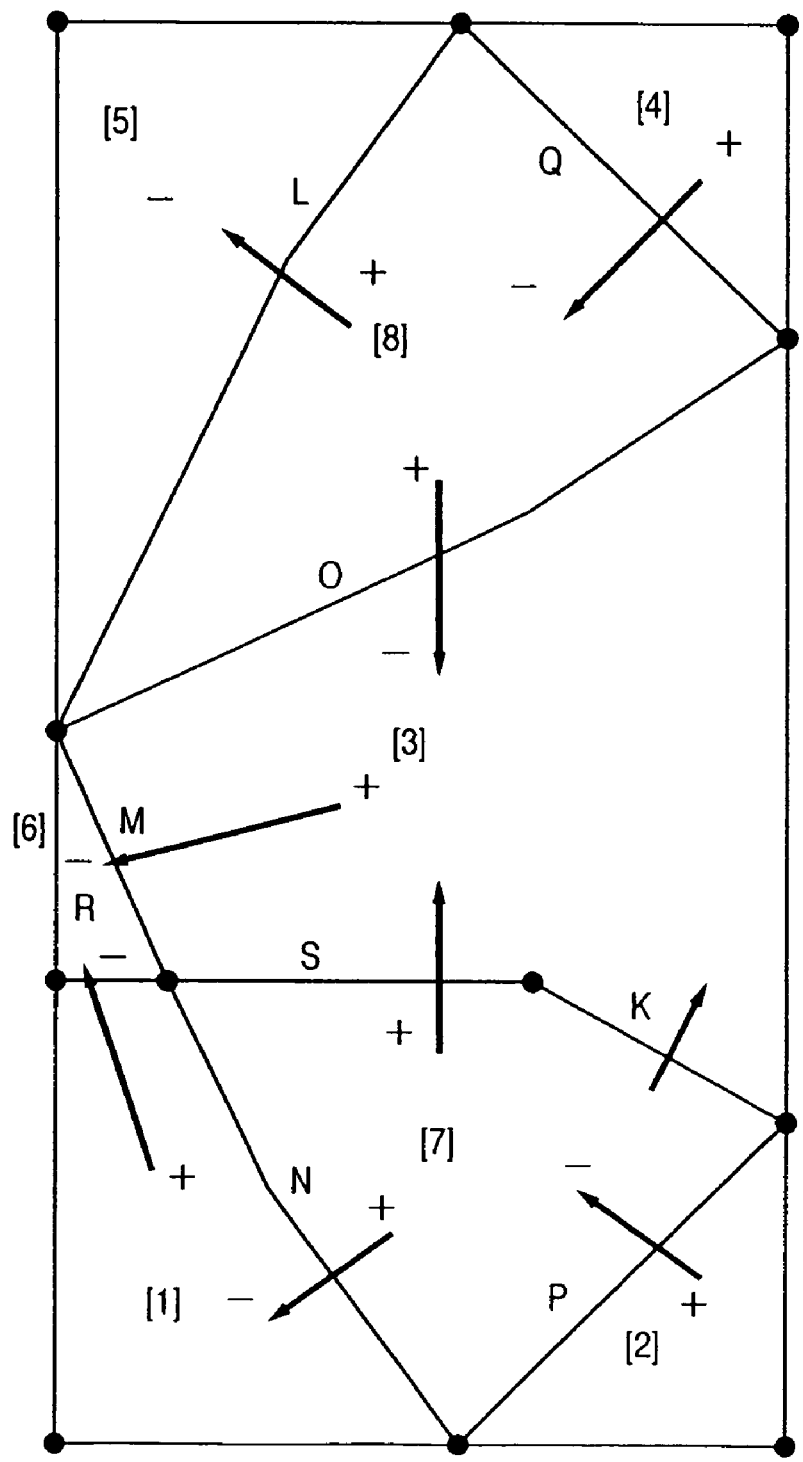
FIG. 10 is a view showing the directed graph expression of the relationship in increase/decrease in number of chips shown in FIG. 9.

FIG. 9 shows directed sides which form same chip number areas [1] to [8]. Sides in opposite directions are connected by arrows in the direction from the positive side to the negative side. This indicates the direction in which the number of available chips decreases. That is, a directed graph having the same chip number areas [1] to [8] as vertexes, as shown in FIG. 10, is formed, in which the relationship in increase/decrease in number of available chips is represented by the directed sides. When such a graph expression is obtained, an incidence matrix can easily be generated. In the directed graph shown in FIG. 10, an incidence matrix U is given by $$U = \begin{array}{c} \phantom{[1]} \\ [1] \\ [2] \\ [3] \\ [4] \\ [5] \\ [6] \\ [7] \\ [8] \end{array} \begin{array}{c} K\phantom{-}L\phantom{-}M\phantom{-}N\phantom{-}O\phantom{-}P\phantom{-}Q\phantom{-}R\phantom{-}S \\ \begin{bmatrix} 0 & 0 & 0 & -1 & 0 & 0 & 0 & 1 & 0 \\ 0 & 0 & 0 & 0 & 0 & 1 & 0 & 0 & 0 \\ -1 & 0 & 1 & 0 & -1 & 0 & 0 & 0 & -1 \\ 0 & 0 & 0 & 0 & 0 & 0 & 1 & 0 & 0 \\ 0 & -1 & 0 & 0 & 0 & 0 & 0 & 0 & 0 \\ 0 & 0 & -1 & 0 & 0 & 0 & 0 & -1 & 0 \\ 1 & 0 & 0 & 1 & 0 & -1 & 0 & 0 & 1 \\ 0 & 1 & 0 & 0 & 1 & 0 & -1 & 0 & 0 \end{bmatrix} \end{array} \quad (6)$$

The elements of the incidence matrix indicate that when an effective circle representative point moves to a same chip number area of the ith row through a side of the jth column, the number of available chips increases (or decreases) by N.

An adjacent matrix W obtained from the incidence matrix U is given by $$W = \begin{array}{c} \phantom{[1]} \\ [1] \\ [2] \\ [3] \\ [4] \\ [5] \\ [6] \\ [7] \\ [8] \end{array} \begin{array}{c} [1]\phantom{-}[2]\phantom{-}[3]\phantom{-}[4]\phantom{-}[5]\phantom{-}[6]\phantom{-}[7]\phantom{-}[8] \\ \begin{bmatrix} 0 & 0 & 0 & 0 & 0 & 1 & 0 & 0 \\ 0 & 0 & 0 & 0 & 0 & 0 & 1 & 0 \\ 0 & 0 & 0 & 0 & 0 & 1 & 0 & 0 \\ 0 & 0 & 0 & 0 & 0 & 0 & 0 & 1 \\ 0 & 0 & 0 & 0 & 0 & 0 & 0 & 0 \\ 0 & 0 & 0 & 0 & 0 & 0 & 0 & 0 \\ 1 & 0 & 1 & 0 & 0 & 0 & 0 & 0 \\ 0 & 0 & 1 & 0 & 1 & 0 & 0 & 0 \end{bmatrix} \end{array} \quad (7)$$

The elements of the adjacent matrix indicate that when an effective circle representative point moves from a same chip number area of the jth column to a same chip number area of the ith row, the number of available chips increases by N.

A same chip number area with the maximum number of available chips is searched from the adjacent matrix W. First, a matrix Z (equation (8)) to be used for search is derived. The matrix Z can be obtained by using a transpose $W^t$ as $Z = W^t - W$. The matrix Z represents the number of chips which increases/decreases when moving from a vertex corresponding to a row to a vertex corresponding to a column.

$$W = \begin{array}{c} \phantom{[1]} \\ [1] \\ [2] \\ [3] \\ [4] \\ [5] \\ [6] \\ [7] \\ [8] \end{array} \begin{array}{c} [1]\ [2]\ [3]\ [4]\ [5]\ [6]\ [7]\ [8] \\ \left[ \begin{array}{rrrrrrrr} 0 & 0 & 0 & 0 & 0 & -1 & 1 & 0 \\ 0 & 0 & 0 & 0 & 0 & 0 & -1 & 0 \\ 0 & 0 & 0 & 0 & 0 & -1 & 1 & 1 \\ 0 & 0 & 0 & 0 & 0 & 0 & 0 & -1 \\ 0 & 0 & 0 & 0 & 0 & 0 & 0 & 1 \\ 1 & 0 & 1 & 0 & 0 & 0 & 0 & 0 \\ -1 & 1 & -1 & 0 & 0 & 0 & 0 & 0 \\ 0 & 0 & -1 & 1 & -1 & 0 & 0 & 0 \end{array} \right] \end{array} \quad (8)$$

All vertexes are traced by the graph search algorithm, and simultaneously, the relative numbers of available chips are obtained. The graph search algorithm can give a high priority to either the width or depth.

Figure 11:
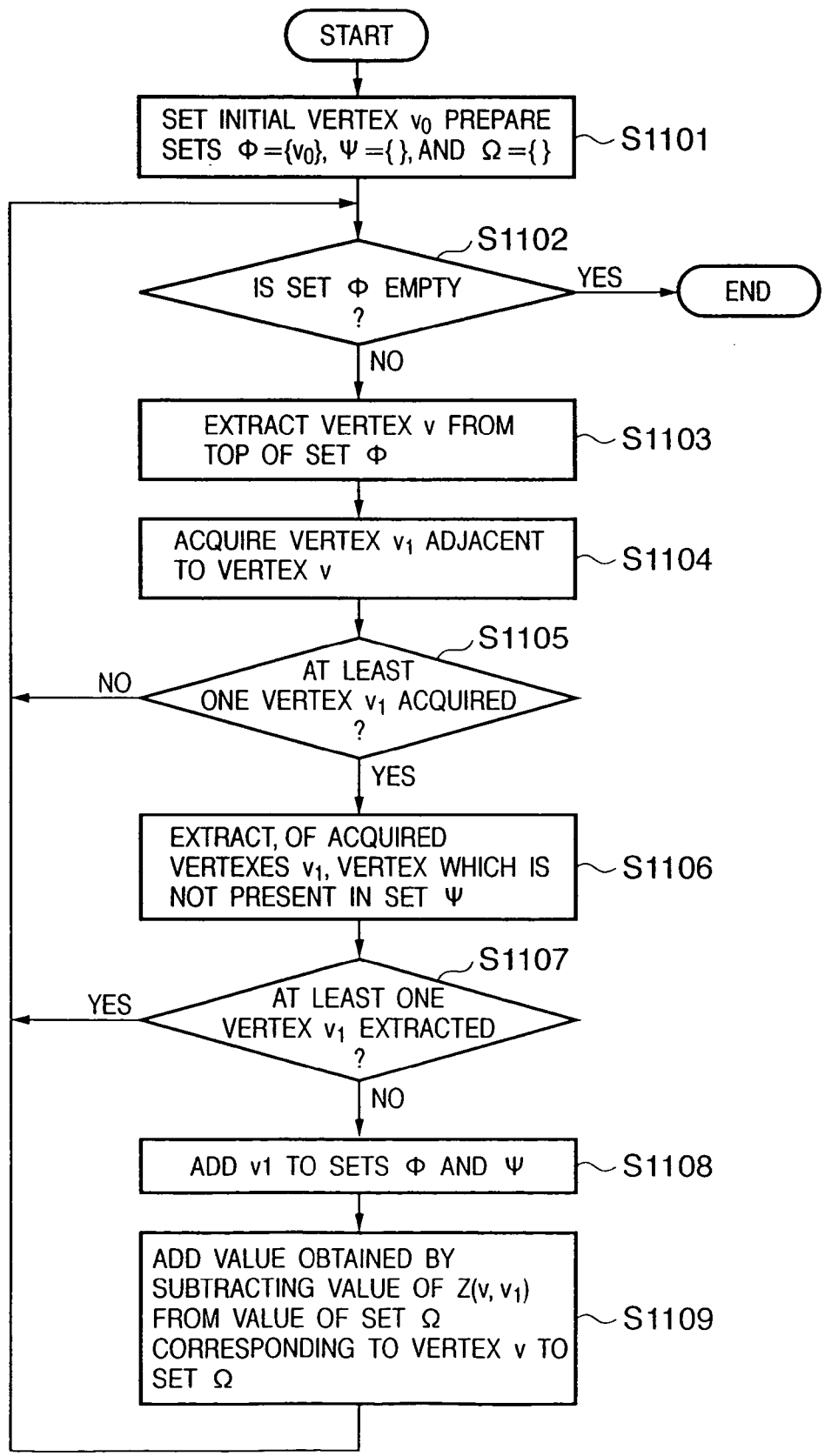
FIG. 11A is a view showing a search algorithm for a same chip number area in which the number of available chips is maximized.
FIG. 11B is a flowchart for explaining processing of implementing the algorithm shown in FIG. 11A.
Figure 12:
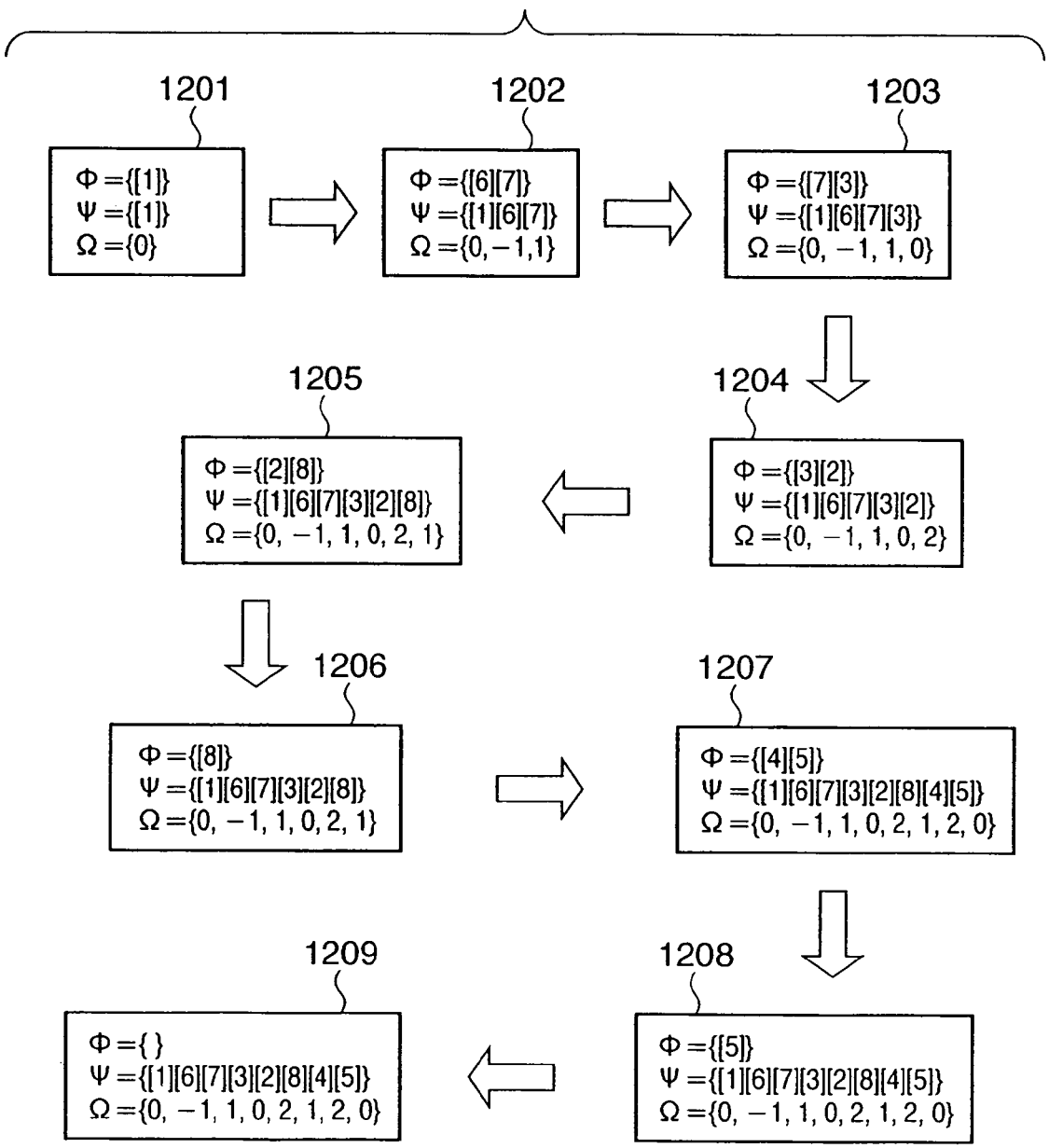
FIG. 12 is a view for explaining the transition of the same chip number area search algorithm in the examples shown in FIGS. 8 and 9.

FIG. 11A shows the algorithm to acquire the relative number of available chips. When this algorithm is actually applied from the matrix Z of equation (8), the operation progresses as shown in FIG. 12. A vertex number is stored in a set Ψ, and its relative score (relative number of available chips) is stored in a set Ω.

FIG. 11B is a flowchart showing processing to execute the algorithm shown in FIG. 11A. This processing will be described by using the example shown in FIG. 12.

When [1] is used as an initial vertex $v_0$, Φ={[1]}, Ψ={[1]}, and Ω={0} are set in step S1101. This is a state 1201 shown in FIG. 12. Since Φ is no empty set, the processing advances from step S1102 to step S1103. In step S1103, the top element of the set Φ is extracted as a vertex v. The extracted element is deleted from the set Φ. At this time, [1] is acquired. In step S1104, a vertex $v_1$ adjacent to the vertex v (element [1]) extracted in step S1103 is acquired. In step S1105, it is determined whether at least one vertex $v_1$ is acquired. If NO in step S1105, the processing returns to step S1102 to extract the next element from the set Φ.

If YES in step S1105, the flow advances to step S1106 to extract, from the vertexes acquired in step S1104, vertexes which are not present in the set Ψ. If no vertex is extracted in step S1106, the processing returns from step S1107 to step S1102. If at least one vertex is extracted, the processing advances from step S1107 to step S1108 to add the extracted vertexes to the sets Φ and Ω.

In step S1109, a value obtained by subtracting $Z(v, v_1)$ from the value of the set Ω corresponding to the vertex v is added to the set Ω.

In the example of the state 1201 shown in FIG. 12, [1] is acquired from the set Φ in step S1103. In step S1104, [6] and [7] are acquired as the vertexes $v_1$ adjacent to [1]. The vertexes [6] and [7] are not present in the set Ψ and are therefore added to the sets Φ and Ψ in step S1108. In step S1109, the value ([6]: 1, [7]: −1) of (v, $v_1$) of the matrix Z represented by equation (8) is subtracted from the value (=0) of the set Ω corresponding to the vertex [1], and the resultant value is added to the set Ω. More specifically, for [6], 0−1=−1 is added. For [7], 0−(−1)=1 is added. A state 1202 is obtained.

When the processing from step S1102 is executed in, e.g., a state 1203, vertexes [1], [2], and [3] adjacent to the vertex [7] are acquired (S1104). The vertex [2] is extracted from them (S1106). Hence, the vertex [2] is added to the sets Φ and Ψ. The value of ([7], [2]) of the matrix Z is "−1". The value corresponding to the vertex [7] of the set Ω is 1. For this reason, 1−(−1)=2 is added to the set Ω as the value corresponding to the vertex [2]. A state 1204 is obtained.

The above-described processing is repeated, and the set Φ changes to an empty set (state 1209), the processing is ended because YES in step S1102.

To obtain the absolute number of available chips, the number of chips which are available when the wafer effective circle representative points are placed in an area corresponding to the initial vertex $v_0$ is counted. The number of chips is added to all scores in the set Ω to define a set Ω'. The elements represent the number of chips available in the respective same chip number areas. If only the optimum wafer position arrangement should be implemented, the number of chips need not be counted.

In this example, the number of available chips in the same chip number area [1] as the initial vertex $v_0$ is two. Table 3 shows the vertex set Ψ and the set Ω' of the number of available chips.

TABLE 3

| | Same chip Number Area | | | | | | | |
|---|---|---|---|---|---|---|---|---|
| | [1] | [6] | [7] | [2] | [3] | [8] | [4] | [5] |
| Number of Available Chips | 2 | 3 | 3 | 4 | 2 | 3 | 4 | 2 |

The relationship in number of available chips between the same chip number areas is grasped in this way. When a same chip number area with a maximum number of available chips is selected, and the effective circle representative point is determined in that area, a chip arrangement with the maximum number of available chips can be obtained. To determine the representative point in the area, for example, the incenter or the center of gravity of the area is obtained. When a plurality of same chip number areas with the maximum number of available chips are detected, the incenter or center of gravity of the same chip number area having the maximum area size is determined as the position of the effective circle representative point to maximize the expected number of available chips.

These same chip number areas are obtained by dividing only the half chip area on the right side. The bilaterally symmetric half chip area on the left side must also be taken into consideration. In addition, the periodicity of the problem must also be taken into consideration. More specifically, in Table 3, the area of a same chip number area which is in contact with the left or right side is doubled and evaluated. For a same chip number area which is in contact with the upper or lower side, the areas of corresponding upper and lower same chip number areas are added and evaluated.

In the example shown in FIG. 10, the center of gravity of [2] and [4] in the bilaterally symmetric connection area is defined as the position of the effective circle representative point. That is, the four corners of each chip are defined as the positions of effective circle representative points.

The effective circle arrangement method to obtain the maximum number of available chips has been described above. Application examples to an apparatus will be described below. In this embodiment, the method is provided as software attached to a semiconductor exposure apparatus. If no software attached to a semiconductor exposure apparatus can be provided, it can also be provided as an independent arithmetic apparatus.

Figure 13:
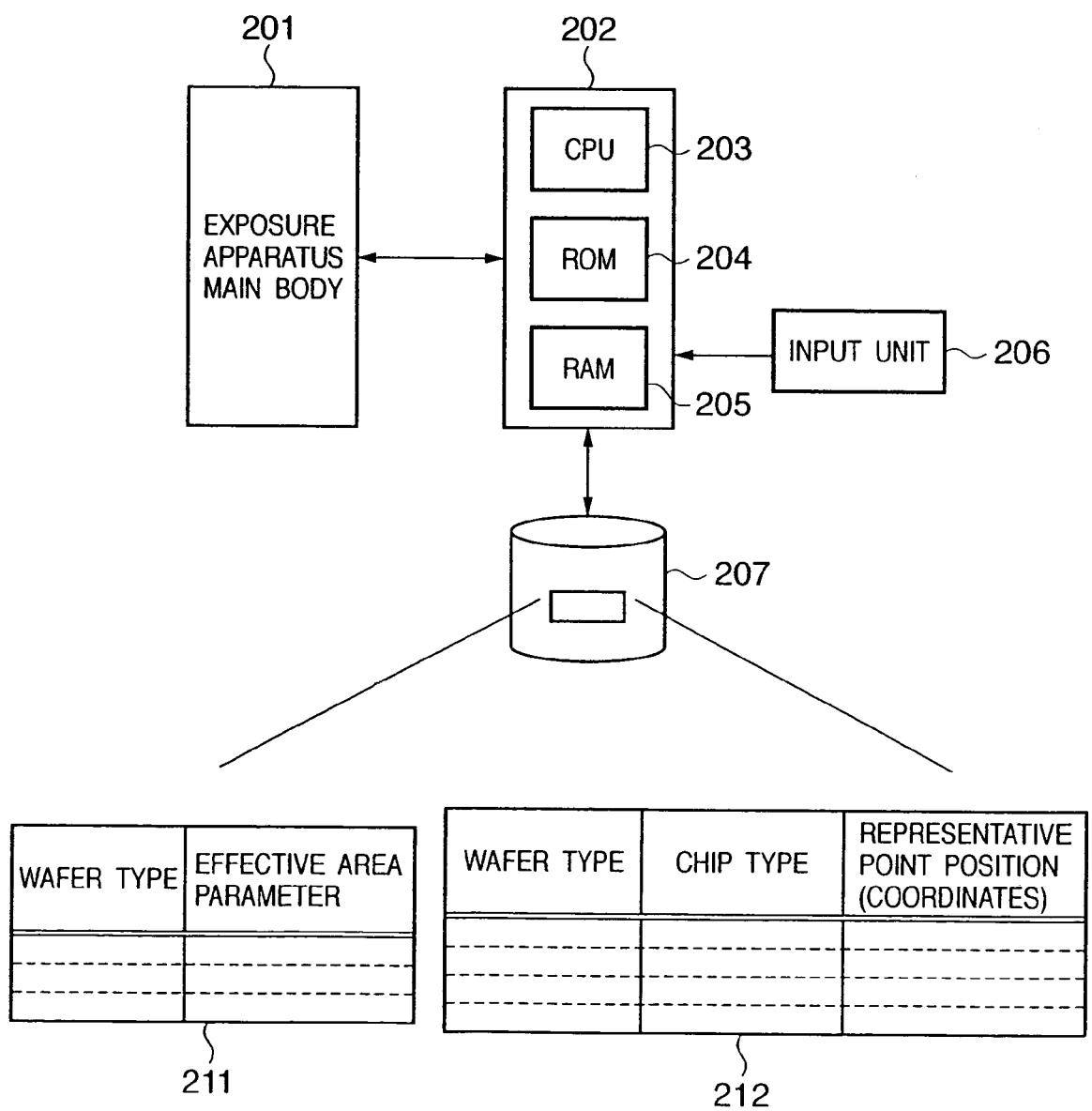
FIG. 13 is a block diagram for explaining the control arrangement of an exposure apparatus according to the embodiment.

FIG. 13 is a block diagram for explaining the arrangement of an exposure apparatus according to this embodiment. Referring to FIG. 13, an exposure apparatus main body 201 prints a chip pattern drawn on a reticle onto a wafer by step-and-repeat method or step-and-scan method. An exposure apparatus controller 202 controls the operations of the respective parts of the exposure apparatus 201. The exposure apparatus controller 202 includes a CPU 203, ROM 204, RAM 205, input unit 206, and external storage device 207.

Figure 14:
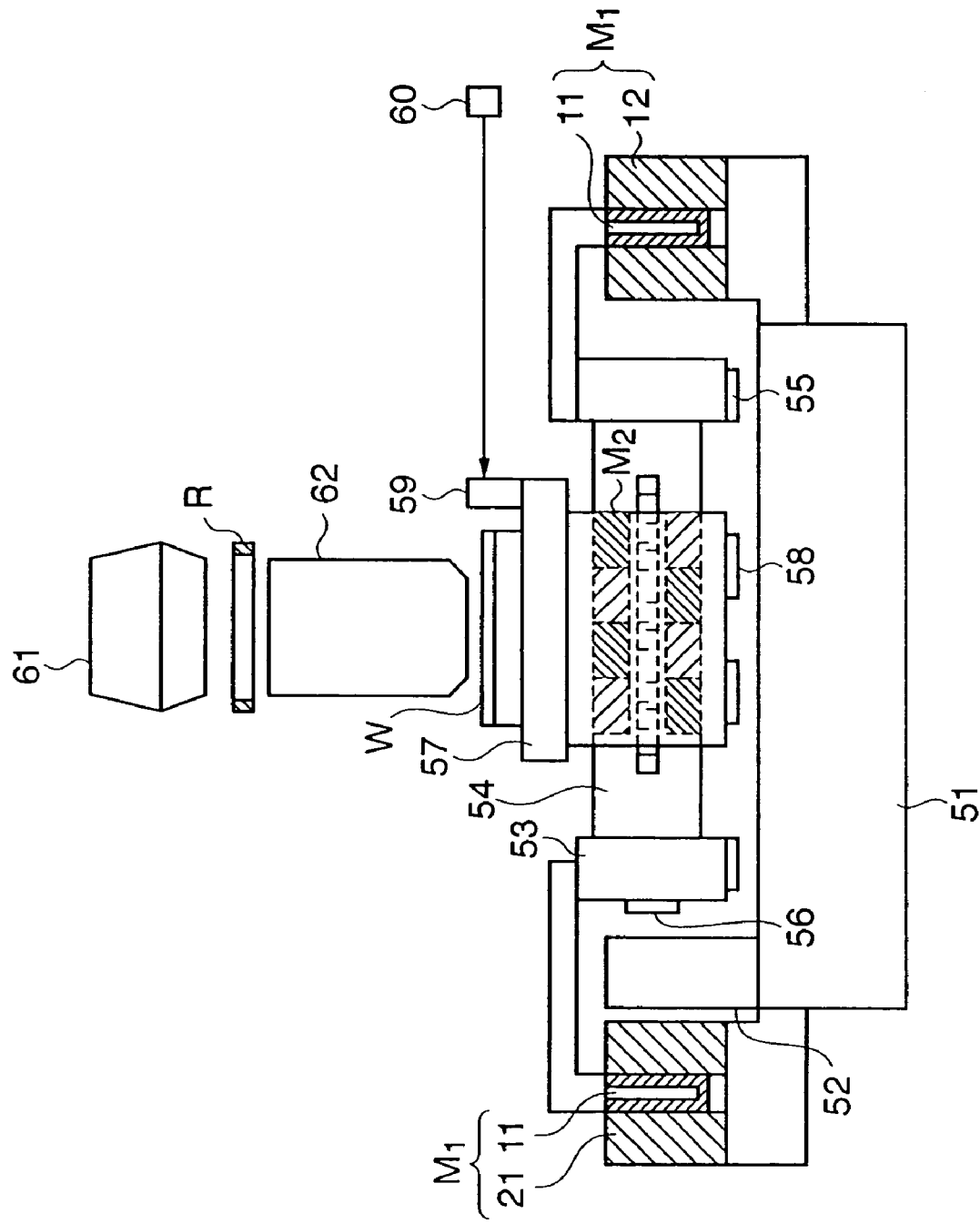
FIG. 14 is a schematic view for explaining the exposure apparatus according to the embodiment.

The exposure apparatus 201 will be described in more detail with reference to FIG. 14. FIG. 14 is a view for explaining the arrangement of the exposure apparatus main body 201 shown in FIG. 13. This embodiment shows a semiconductor device manufacturing exposure apparatus which includes, as a wafer stage, a stage unit having linear motors M1 and M2 as driving units.

This exposure apparatus is used to manufacture a semiconductor device such as a semiconductor integrated circuit or a device having a small pattern such as a micromachine or a thin-film magnetic head. In this exposure apparatus, a semiconductor wafer W serving as a substrate is irradiated, through a reticle R as a master, with exposure light ("exposure light" is a general term for visible light, ultraviolet light, EUV light, X-rays, electron beam, and charged particle beam) as an exposure energy from a light source 61 through a projecting lens ("projecting lens" is a general term for a refractive lens, reflecting lens, catadioptic lens system, and charged particle lens) 62 serving as a projecting system, thereby forming a desired pattern on the substrate.

In this exposure apparatus, a guide 52 and linear motor stator 21 are fixed on a surface plate 51. The linear motor stator 21 has a polyphase electromagnetic coil. A linear motor movable element 11 has a permanent magnet group. The linear motor movable element 11 is connected, as a movable unit 53, to a movable guide 54 serving as a stage. The movable guide 54 is moved in the direction of normal to the drawing surface by driving the linear motor M1. The movable unit 53 is supported by a hydrostatic bearing 55 on the basis of the upper surface of the surface plate 51 and by a hydrostatic bearing 56 on the basis of the side surface of the guide 52.

A movable stage 57 arranged over the movable guide 54 is supported by a hydrostatic bearing 58. The movable stage 57 is driven by the linear motor M2, like the above-described linear motor. The movable stage 57 moves in the horizontal direction on the drawing surface on the basis of the movable guide 54. The movement of the movable stage 57 is measured by using a mirror 59 and interferometer 60 fixed on the movable stage 57.

The wafer W serving as a substrate is held on the chuck mounted on the movable stage 57. The pattern of the reticle R serving as a master is reduced and transferred to each area on the wafer W by step-and-repeat or step-and-scan by using the light source 61 and projecting optical system 62. The wafer stage portion of the exposure apparatus shown in FIG. 14 can also be applied to an exposure apparatus which directly draws a circuit pattern on a semiconductor wafer and exposes the resist without using any mask.

In the exposure apparatus controller 202, the CPU 203 executes a control program stored in the ROM 204 or a control program loaded from the external storage device 207 to the RAM 205, thereby implementing various kinds of control of the exposure apparatus 201. In the exposure apparatus of this embodiment, the above-described program to determine the relative position between a wafer and a chip lattice is also executed.

Figure 15:
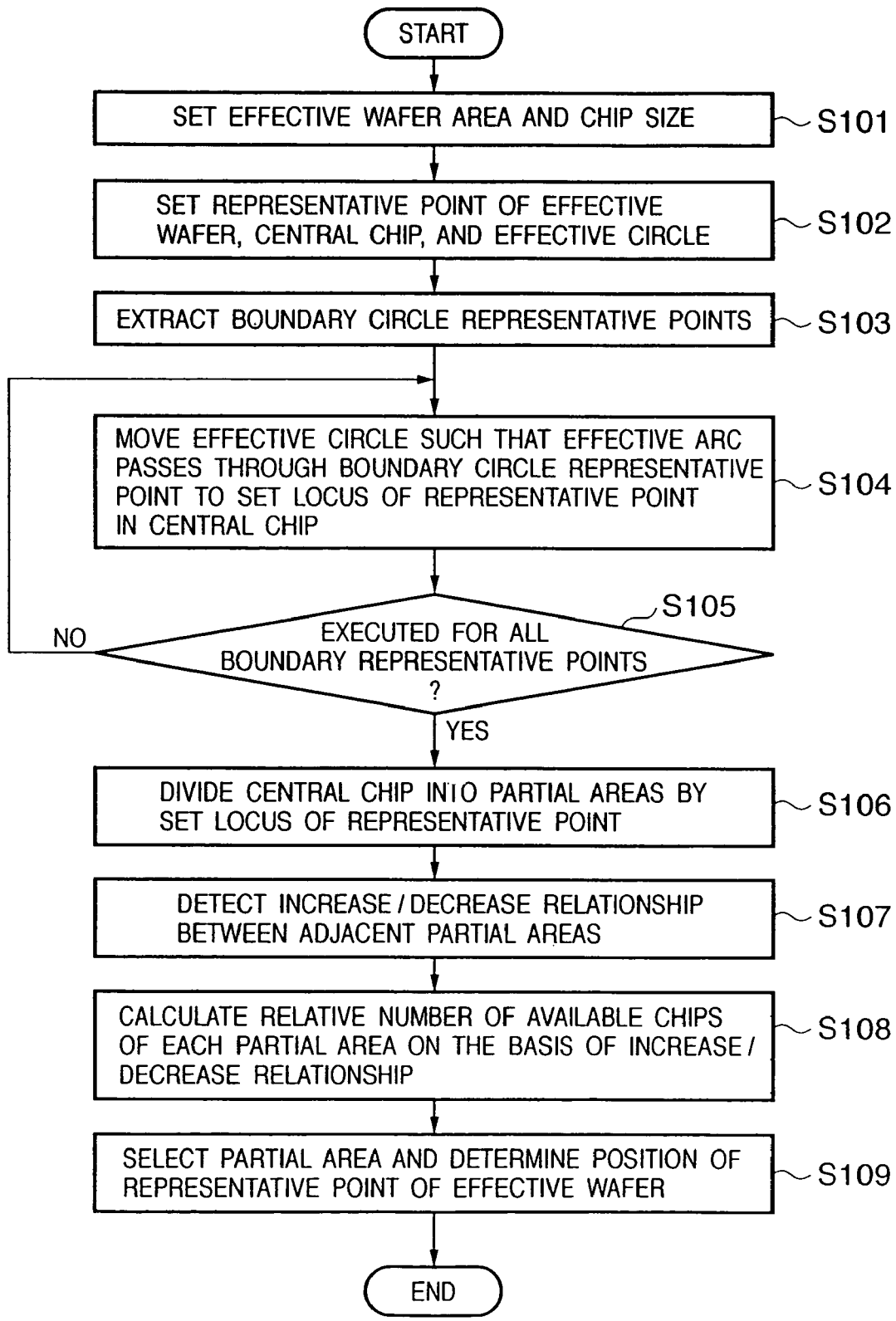
FIG. 15 is a flowchart for explaining chip arrangement position determination processing according to the embodiment.

FIG. 15 is a flowchart for explaining chip arrangement position determination processing executed by the CPU 203. When the chip arrangement determination processing is executed, in step S101, the user is caused to set the wafer effective area and chip size through the input unit 206. To set them, the user inputs the parameters (parameters (e.g., wafer diameter, orientation flat length, and ineffective width) to determine the wafer effective area and the chip size (vertical and horizontal sizes)) as numerical values. For the wafer, parameters to determine the effective area may be stored in advance in the external storage device 207 for each wafer type and read out in accordance with the wafer type designated by the user.

In step S102, the effective arc 105 is determined from the set wafer effective area and chip size. The chip having its center at the coordinate origin is set as the central chip 108. In step S103, the boundary representative points 110 are extracted in accordance with the procedure described by using expressions (4-a), (4-b), (5-a), (5-b), and (5-c).

For one of the extracted boundary representative points, in step S104, the effective circle (wafer effective area) is moved such that the state in which the boundary circle representative point is in contact with the effective arc, thereby setting the locus of the representative point in the central chip 108. More specifically, of the loci determined by expressions (3-a) to (3-c), the loci present in the central chip 108 are determined. This processing is executed for all boundary circle representative points extracted in step S103 (step S105).

The flow advances to step S106 to divide the central chip 108 into a plurality of partial areas by the loci set in the central chip 108, thereby forming same chip number areas. In step S107, the increase/decrease relationship between adjacent same chip number areas is detected, as described above with reference to FIGS. 7 to 10, to generate a directed graph. In step S108, on the basis of the increase/decrease relationship (directed graph), the relative number of available chips of each same chip number area is calculated (FIGS. 11 and 12). In step S109, on the basis of the calculated relative numbers of available chips, the same chip number area having a maximum number of available chips is selected. The incenter or the center of gravity of the selected same chip number area is set as the representative point position of the wafer effective area.

The exposure apparatus controller 202 determines the relative position between the wafer and the chip lattice on the basis of the representative point position calculated in the above-described manner and controls the exposure process. The representative point position calculated in the above-described way may be held in correspondence with each set of the wafer type and chip type so as to be usable later. For example, the representative point positions are held as in, e.g., a table 212. If a set which coincides with the combination of the chip type and wafer type designated from the input unit 206 is registered, the representative point position (relative position between the wafer and the chip lattice) registered there is used. In this case, the same calculation need not be repeated, and the efficiency can be increased.

Examples of calculations executed by actually giving parameters of wafer shapes and chip shapes will be described below. Three characteristic examples in which the chip size changes for the following wafer conditions and chip conditions will be described below. The superiority of the present invention over the methods (methods A to C) proposed in patent references 1 to 3 will be described.

<Condition>

Wafer diameter: 200 mm

Orientation flat length: 57.5 mm

Chip shape: square
Effective area: at least 10 mm inside from wafer outer periphery

EXAMPLE 1

In Example 1, the chip size is 15 mm square. This corresponds to a semiconductor chip having a relatively large size for, e.g., a CPU for a workstation.

Figure 16:
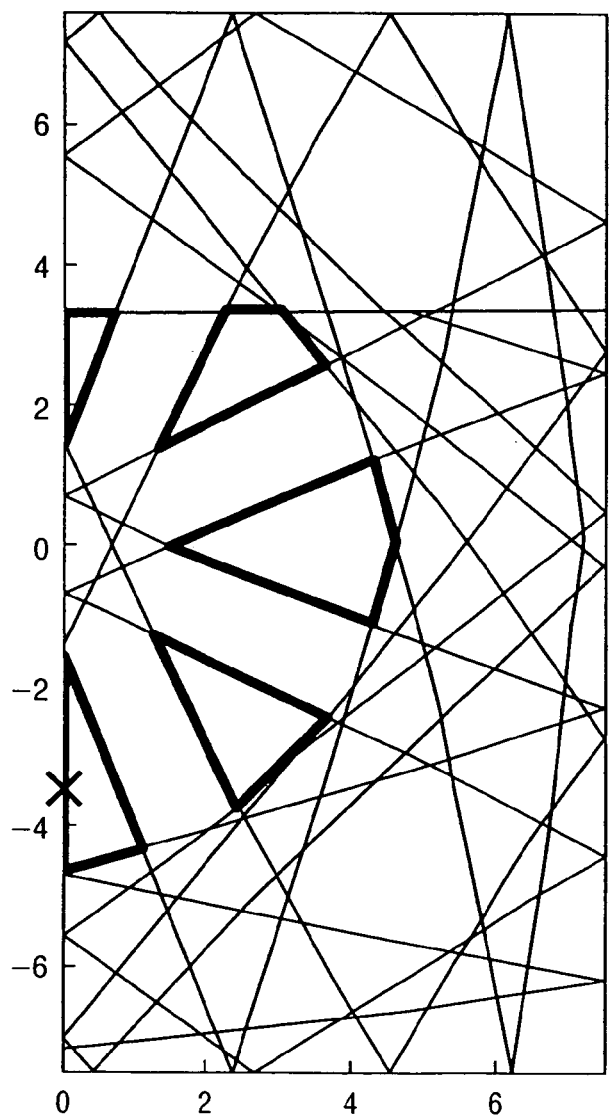
FIG. 16 is a view showing an example of an arrangement position calculation result when the chip arrangement position determination processing of the embodiment is applied to a 200-mm wafer in a 15-mm chip lattice.

Referring to FIG. 16, same chip number areas with maximum numbers of available chips are derived by the method described in this embodiment, and the same chip number areas are indicated by bold lines. The center of gravity of the same chip number area having a largest continuous area is indicated by x. This position is determined as the representative point position of the wafer effective area.

In the example shown in FIG. 16, the same chip number areas with maximum numbers of available chips are distributed to five positions in the half chip area, and the total area of them is as large as about 10%. Four areas as the targets of the method A are not included in these areas. Hence, the number of available chips cannot be maximized by the method A.

In the method B, the position of the effective circle representative point with a maximum number of available chips can be detected if the pitch is not excessively large. In the method C, the position of the effective circle representative point with a maximum number of available chips can reliably be detected.

However, in both the methods B and C, if the plurality of positions at which the number of available chips is maximized are obtained, it may be rather difficult to select one of them.

EXAMPLE 2

Figure 17:
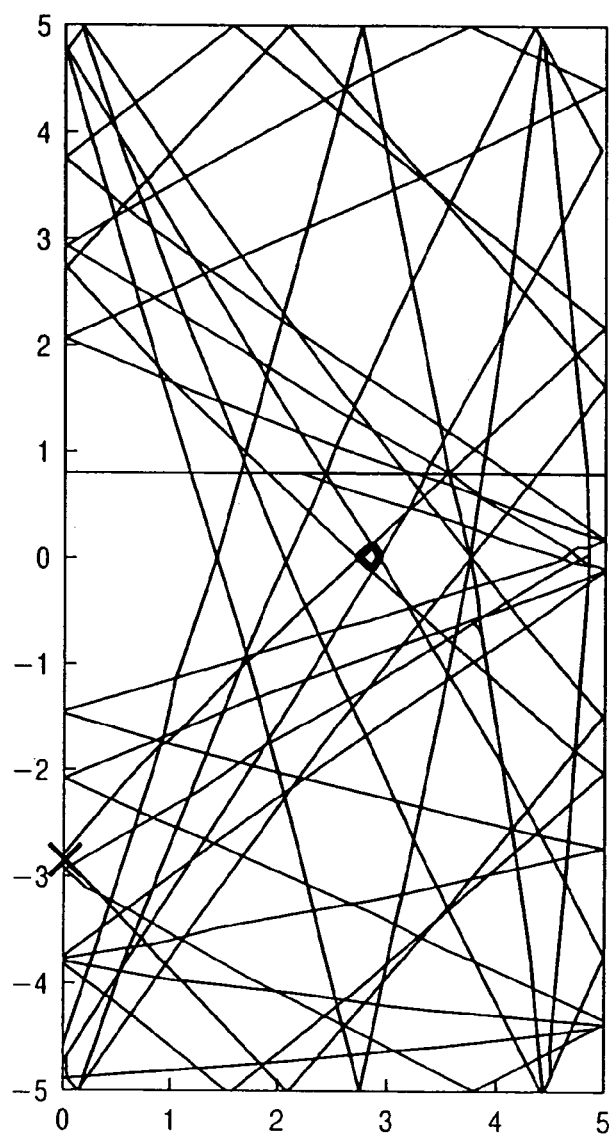
FIG. 17 is a view showing an example of an arrangement position calculation result when the chip arrangement position determination processing of the embodiment is applied to a 200-mm wafer in a 10-mm chip lattice.

In the example shown in FIG. 17, the chip size is 10 mm square. This corresponds to a normal semiconductor chip size for, e.g., a CPU for a general personal computer. In this case, the same chip number areas with maximum numbers of available chips are distributed to two positions in the half chip area. Both areas are very small, and the total area is less than 0.1%.

In the method A, neither same chip number areas can be detected. In the method B, they are missed at a high probability unless 1,000 or more points to be compared are set.

EXAMPLE 3

Figure 18:
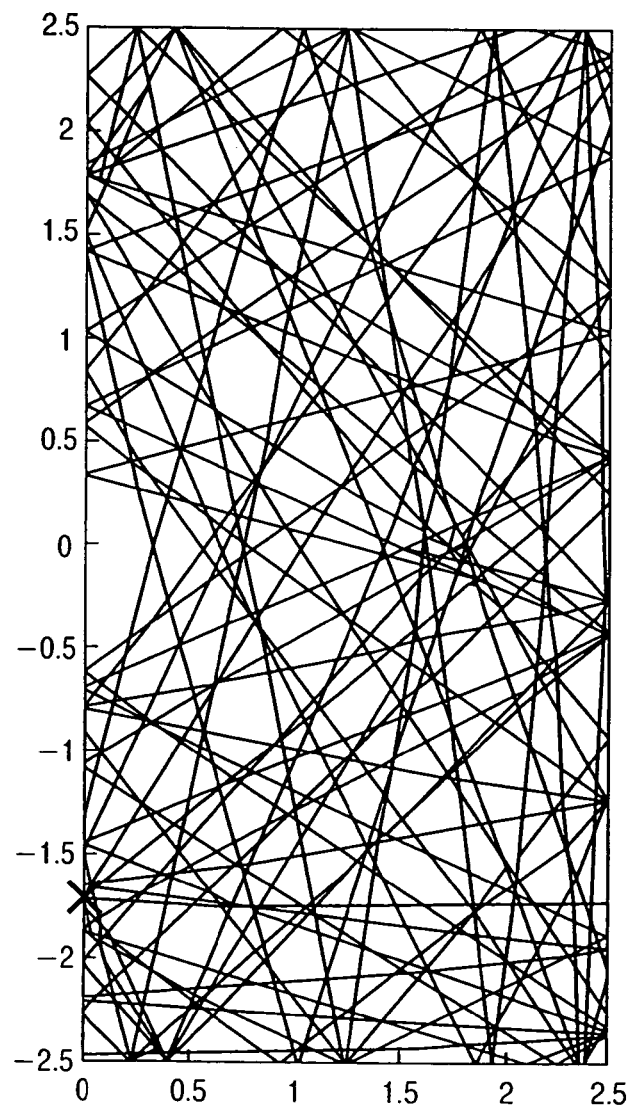
FIG. 18 is a view showing an example of an arrangement position calculation result when the chip arrangement position determination processing of the embodiment is applied to a 200-mm wafer in a 5-mm chip lattice.

In the example shown in FIG. 18, the chip size is 5 mm square. This corresponds to a relatively small chip size used for, e.g., a memory for a personal computer. In this case, only one same chip number area with a maximum number of available chips is present in the half chip area. The same chip number area is present at none of the center, corner, or center of side of the chip. For this reason, in the method A, an optimum position cannot be detected. The area of an optimum same chip number area is as small as 0.0002%. In the method B, it cannot be detected unless 1,000,000 or more points to be compared are set. Hence, very long calculation time is necessary for finding the optimum solution.

The methods are compared in the three examples. In any example, the chip arrangement determination method of the present invention can always indicate the position of an optimum effective circle representative point.

According to the above-described method, even when an alignment error is present in setting the wafer position, the relative position between the wafer and the chip lattice, which maximizes the number of available chips, can be obtained at a high probability. For this reason, this method is effective for cost reduction in manufacturing a device such as a semiconductor chip.

Figure 19:
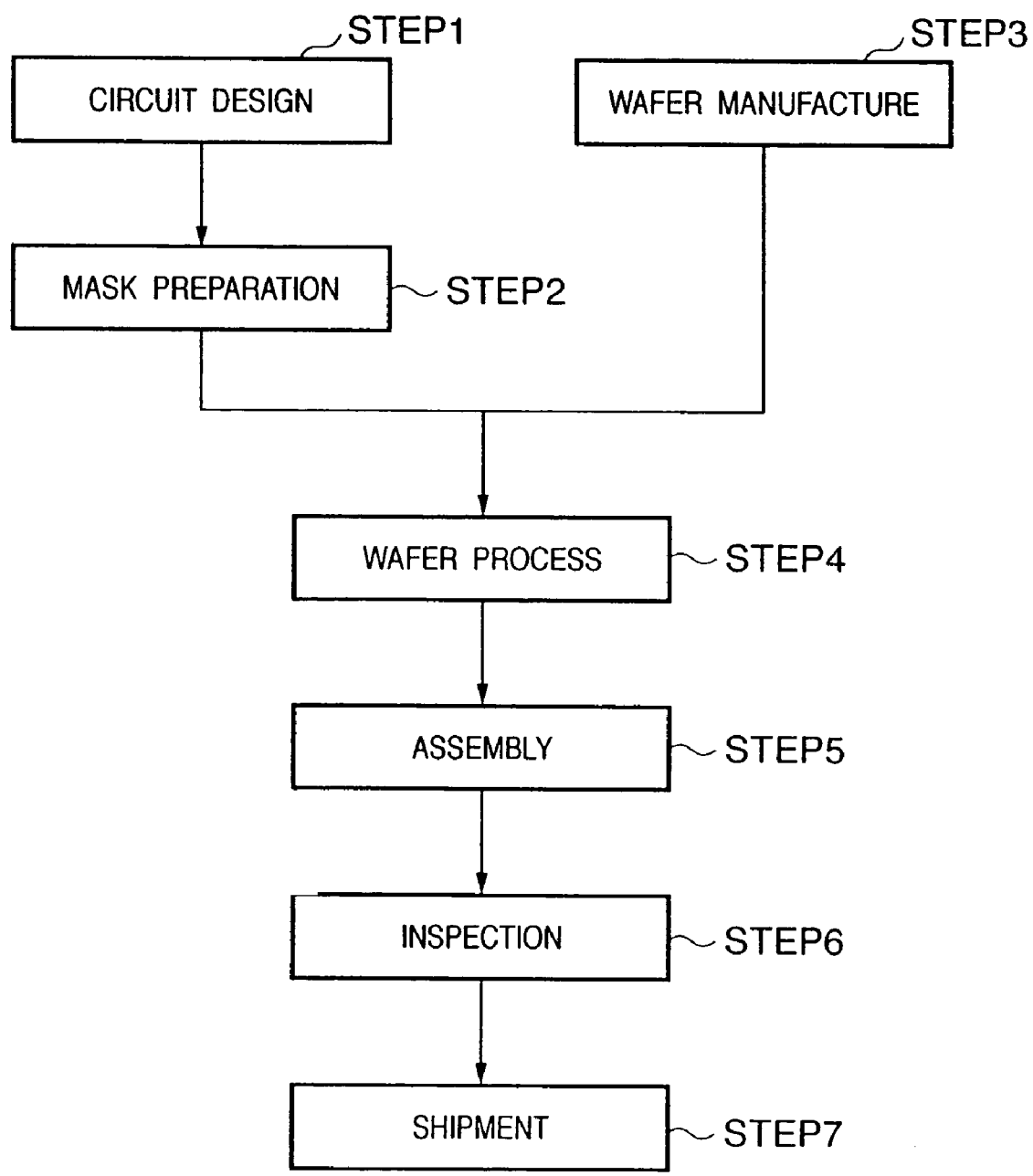
FIG. 19 is a flowchart showing a semiconductor device manufacturing flow.

A semiconductor device manufacturing flow using this exposure apparatus will be descried next. FIG. 19 is a flowchart showing the entire semiconductor device manufacturing flow. In step 1 (circuit design), the circuit of a semiconductor device is designed. In step 2 (mask preparation), a mask having is prepared on the basis of the designed circuit pattern.

In step 3 (wafer manufacture), a wafer is manufactured by using a material such as silicon. In step 4 (wafer process) called a preprocess, an actual circuit is formed on the wafer by using the exposure apparatus by lithography using the mask and wafer. In step 5 (assembly) called a post-process, a semiconductor chip is formed from the wafer prepared in step 4. This step includes assembling processes such as assembly (dicing and bonding) and packaging (chip encapsulation). In step 6 (inspection), inspections including operation check test and durability test of the semiconductor device manufactured in step 5 are performed. A semiconductor device is completed with these processes and shipped in step 7.

The wafer process in step 4 includes the following steps. In the oxidation step, the surface of the wafer is oxidized. In the CVD step, an insulating film is formed on the wafer surface. In the electrode formation step, an electrode is formed on the wafer by deposition. In the ion implantation step, ions are implanted into the wafer. In the resist process step, a photosensitive material is applied to the wafer. In the exposure step, the circuit pattern is transferred to the wafer which has undergone the resist process step by using the exposure apparatus. In the development step, the wafer exposed in the exposure step is developed. In the etching step, portions other than the resist image developed in the development step are etched. In the resist removal step, any unnecessary resist remaining after etching is removed. By repeating these steps, a multilayered structure of circuit patterns is formed on the wafer.

According to the present invention, a technique of determining the relative position between a photosensitive substrate and a chip lattice, which can solve the problems of the prior arts, can be provided.

The object of the present invention can also be achieved by supplying a storage medium which stores software program codes for implementing the function of the above-described embodiment to a system or apparatus and causing the computer (or CPU or MPU) of the system or apparatus to read out and execute the program codes stored in the storage medium.

In this case, the program codes read out from the storage medium implement the function of the above-described embodiment by themselves, and the storage medium which stores the program codes constitutes the present invention.

As the storage medium to supply the program codes, for example, a flexible disk, hard disk, optical disk, magnetooptical disk, CD-ROM, CD-R, magnetic tape, nonvolatile memory card, ROM, or the like can be used.

The function of the above-described embodiment is implemented not only when the readout program codes are executed by the computer but also when the OS (Operating System) running on the computer performs part or all of actual processing on the basis of the instructions of the program codes.

The function of the above-described embodiment is also implemented when the program codes read out from the storage medium are written in the memory of a function expansion board inserted into the computer or a function expansion unit connected to the computer, and the CPU of the function expansion board or function expansion unit performs part or all of actual processing on the basis of the instructions of the program codes.

As many apparently widely different embodiments of the present invention can be made without departing from the spirit and scope thereof, it is to be understood that the invention is not limited to the specific embodiments thereof except as defined in the appended claims.

CLAIM OF PRIORITY

This application claims priority from Japanese Patent Application No. 2004-118223 filed on Apr. 13, 2004, which is hereby incorporated by reference herein.

What is claimed is:

1. A method of determining a relative position between a chip lattice comprised of rectangular cells, each of which has a size of a chip to be formed on a substrate and an effective area on the substrate, said method comprising:

a division step of dividing one representative cell in the chip lattice into a plurality of partial areas in accordance with an existing area, of a representative point of the effective area, in which chip sets trimmed from the chip lattice with the effective area are identical;

a specifying step of specifying a partial area corresponding to a chip set including a maximum number of chips from the plurality of partial areas; and a setting step of setting the representative point in the partial area specified in said specifying step, wherein said division step obtains, as a boundary of the partial area, a locus of the representative point in the representative cell by moving the effective area so that a cell which has a lattice point selected from the chip lattice as a lattice point farthest from the representative point is included in the effective area and a periphery of the effective area is in contact with the selected lattice point, wherein the lattice point selected in said division step is within a locus of the periphery of the effective area corresponding to the movement of the representative point in the representative cell, wherein an effective arc is obtained by excluding from the periphery an arc which has, at two ends thereof, intersections, between a line parallel to a vertical line of the chip lattice and the periphery of the effective area, having a distance equal to a vertical dimension of the cell, and an arc which has, at two ends thereof, intersections, between a line parallel to a horizontal line of the chip lattice and the periphery of the effective area, having a distance equal to a horizontal dimension of the cell, and a closed curve is obtained with the effective arc and a line segment which connects the two ends of the excluded arc, and the lattice point selected in said division step is within a locus of the closed curve corresponding to the movement of the representative point in the representative cell.

2. A method according to claim 1, further comprising an acquisition step of acquiring information concerning the effective area and the size of the chip.

3. A method according to claim 1, wherein said specifying step comprises a calculation step of expressing an increase/decrease relationship in number of chips to be acquired between the partial areas adjacent to each other by a directed graph and calculating a relative value of the number of chips to be acquired of each of the partial areas using a graph search algorithm.

4. A method according to claim 1, wherein in said specifying step, if a plurality of the partial area corresponding to a chip set including a maximum number of chips are present, then a partial area having a maximum area is specified from the plurality of the partial area.

5. The method according to claim 1, wherein said setting step sets one of a center of gravity and an inner center of the partial area specified in said specifying step as the representative point.

* * * * *

UNITED STATES PATENT AND TRADEMARK OFFICE
CERTIFICATE OF CORRECTION

| | | |
|---|---|---|
| PATENT NO. | : 7,346,886 B2 | Page 1 of 1 |
| APPLICATION NO. | : 11/103459 | |
| DATED | : March 18, 2008 | |
| INVENTOR(S) | : Youzou Fukagawa et al. | |

It is certified that error appears in the above-identified patent and that said Letters Patent is hereby corrected as shown below:

<u>COLUMN 1</u>:

Line 35, "chips" should be deleted and "many" should read --many chips--.

<u>COLUMN 9</u>:

Line 46, "$\Phi$ and $\Omega$." should read --$\Phi$ and $\Psi$.--.

Signed and Sealed this

Tenth Day of February, 2009

JOHN DOLL
*Acting Director of the United States Patent and Trademark Office*